(12) United States Patent
Hori

(10) Patent No.: US 7,567,073 B2
(45) Date of Patent: Jul. 28, 2009

(54) INTERFACE CIRCUIT AND MEMORY CONTROLLER

(75) Inventor: Takahiro Hori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 242 days.

(21) Appl. No.: 11/802,846

(22) Filed: May 25, 2007

(65) Prior Publication Data

US 2007/0291830 A1 Dec. 20, 2007

(30) Foreign Application Priority Data

May 26, 2006 (JP) .............................. 2006-147094

(51) Int. Cl.
*G01R 23/175* (2006.01)
*G11C 7/22* (2006.01)
*G01P 21/00* (2006.01)

(52) U.S. Cl. ..................... 324/76.54; 365/194; 702/108

(58) Field of Classification Search .............. 324/76.77, 324/76.11, 76.15, 76.24, 76.38, 76.42, 76.52, 324/76.54, 76.58, 76.61; 702/108, 127, 189; 365/194

See application file for complete search history.

(56) References Cited

U.S. PATENT DOCUMENTS

| | | | | |
|---|---|---|---|---|
| 6,466,491 | B2 * | 10/2002 | Yanagawa | 365/194 |
| 6,570,944 | B2 * | 5/2003 | Best et al. | 375/355 |
| 7,123,051 | B1 * | 10/2006 | Lee et al. | 326/40 |
| 7,228,248 | B2 * | 6/2007 | Ochi et al. | 702/108 |
| 7,239,575 | B2 * | 7/2007 | Kim | 365/189.05 |
| 7,321,525 | B2 * | 1/2008 | Matsui | 365/233.12 |
| 7,412,616 | B2 * | 8/2008 | Matsui et al. | 713/401 |
| 2005/0047192 | A1 | 3/2005 | Matsui et al. | |
| 2008/0256282 | A1 * | 10/2008 | Guo et al. | 710/305 |

FOREIGN PATENT DOCUMENTS

JP 2005-78547 3/2005

* cited by examiner

*Primary Examiner*—Vincent Q Nguyen
*Assistant Examiner*—Hoai-An D Nguyen
(74) *Attorney, Agent, or Firm*—McGinn IP Law Group PLLC

(57) ABSTRACT

A memory controller includes a variable delay circuit for phase-shifting a signal and an interface circuit suited for performing a test of a controller so that the memory controller realizes a test of a delay failure detection in a real-time speed operation at the time of the test.

19 Claims, 17 Drawing Sheets

<AT WRITE TIME>

<AT READ TIME>

US 7,567,073 B2

INTERFACE CIRCUIT AND MEMORY CONTROLLER

This application is based upon and claims the benefit of priority from Japanese patent application No. 2006-147094, filed on May 26, 2006, the disclosure of which is incorporated herein in its entirety by reference.

FIELD OF THE INVENTION

This invention relates to a semiconductor device and to a memory controller that includes a variable delay circuit for phase-shifting a signal. More particularly, the invention relates to an interface circuit suited for performing a loopback test of an SDRAM (Synchronous DRAM) controller.

BACKGROUND OF THE INVENTION

The current market requires that a DDR (Double Data Rate) SDRAM controller have high-speed memory access at a data rate of 533 or 666 MHz. In terms of design, various contrivances for raising speed are in demand.

In a technique of testing a DDR SDRAM controller as well, a test based upon high-speed operation at actual frequencies is essential in order to detect faults, which include delay faults. Mainly, use is made of a loopback test that is not dependent upon the supported frequency region of the tester. In the loopback test of a controller, the memory (DDS SDRAM) is not connected to the controller at the time of the test, data for transmission is returned to the receiving side within the controller and the received data is compared with the expected-value data (the data for transmission), whereby a test at a high-speed transfer rate is implemented without requiring a high-speed tester.

In write access to a DDR SDRAM, a setup spec (tDS) and a hold spec (tDH) have been defined between data (DQ) 1 and a data strobe (DQS) 2, as illustrated in FIG. 12A. Hence there are cases where a phase shift circuit (variable delay circuit) is provided on the side of the controller in order to assure that the phase difference between these will be on the order of 90° of the memory clock period and to supply this to the side of the DDR SDRAM. It should be noted that set-up time is the minimum time in which data must be stabilized prior to the effective edge of the clock (in this case, the rising edge of the data strobe) in a latch circuit, etc. Hold time is the minimum time over which data must be held following the effective edge of the clock.

In read access from a DDR SDRAM, the specifications on the side of the DDR SDRAM are that data 3 and a data strobe 4 are output at the same phase, as illustrated in FIG. 12B. In order to capture data using a 90° phase-shifted signal as the trigger with respect to the data strobe 4 on the controller side, an arrangement in which a phase shift circuit (variable delay circuit) is mounted on the side of the controller generally is adopted (see Patent Document 1).

FIG. 13 illustrates an example of the typical circuit configuration of a DDR SDRAM controller having a loopback test function. The structural elements shown in FIG. 13 will be described below. In FIG. 13, a clock signal (Clock) 5 is an internal clock signal having the same period as that of a clock signal supplied to a memory DDR SDRAM), not shown. A variable delay circuit 6 constituting a phase shift circuit receives the internal clock signal (Clock) 5 as an input, adds a 90°-phase difference to the internal clock signal (Clock) 5 and outputs the resultant signal. Although there is no particular limitation, the variable delay circuit 6 in the DDR SDRAM comprises an MDLL (Master Delay Lock Loop) and an SDLL (Slave Delay Lock Loop). The MDLL discriminates the amount of delay from the degree of a shift, which is indicated by a phase shift amount signal [OFFSET (W)] 7 that is output from a normal-mode phase shift amount control circuit 23, and generates a delay-changeover control signal corresponding to the period of the internal clock signal (Clock) 5. In accordance with the delay-changeover control signal from the MDLL, the SDLL adds a delay to the internal clock signal 5 and outputs the resultant signal.

The phase shift amount signal 7 is a signal delivered from the normal-mode phase shift amount control circuit 23 to the variable delay circuit 6 in order to set the amount of phase shift of the variable delay circuit 6 when the normal mode (ordinary operating mode) is in effect.

The normal-mode phase shift amount control circuit 23 includes a register (not shown) which, when the normal mode is in effect, is capable of being set to a fixed value indicating 90° or to a value from a host system (not shown). The register (not shown) holds the shift degree at the time of the normal mode and is capable of being set from a host apparatus such as a CPU (not shown) by software or is set from an external circuit such as a calibration circuit (not shown) that derives the optimum degree of shift.

A selector 8, which receives as inputs the delayed output of the variable delay circuit 6 and a signal having a phase difference of 180° with respect to the internal clock signal 5, bypasses the variable delay circuit 6 (selects the signal having the phase difference of 180° with respect to the internal clock signal 5) and makes the phases of output of the data signal and output of the data strobe signal the same when the circuit on the input side is tested. That is, the selector 8 selects the output from the variable delay circuit 6 when the normal mode is in effect and selects a signal having a phase difference of 180° with respect to the internal clock signal 5 when the circuit on the input side is subjected to a loopback test. In order to generate a signal having a phase difference of 180° with respect to the internal clock signal 5, use is made of a signal that is the result of reversing the polarity of the internal clock signal 5 by an inverter circuit 31, by way of example.

The output of the selector 8 is supplied to a write-data sampling circuit (data output circuit) 10 as a clock signal 9 for data output. The data output circuit 10 includes flip-flops F/F1 and F/F2 for sampling write data in response to the clock signal. The flip-flops F/F1 and F/F2 respectively sample write data (POS) and write data (NEG) at the rising and falling edges of the clock signal 9 for data output. The outputs of the flip-flops F/F1 and F/F2 are multiplexed by a multiplexer (selector) 10-1, and the write-data signal which undergoes a double-rate conversion is output. That is, two items of write data are output in one clock cycle. When the clock signal 9 for data output is HIGH and LOW, the multiplexer 10-1 selects and outputs the outputs of the flip-flops F/F1 and F/F2, respectively. It should be noted that the write data (POS) and write data (NEG) represent write data sampled at the positive-going (rising) edge and negative-going (falling) edge of the clock signal 9 for data output, respectively, in the flip-flops F/F1 and F/F2.

A bi-directional interface buffer 11 has an output buffer 11-1 for outputting a data signal and an input buffer 11-2 for inputting a data signal. The output buffer 11-1 outputs the signal from the data output circuit 10 to a DQ external terminal 13 serving as a data input/output terminal. The input buffer 11-2 receives a signal from the DQ external terminal 13. In the normal mode, the output buffer 11-1 is set to a high-impedance state (off) at the time of data input.

A buffer 12 is a bi-directional interface buffer for receiving and outputting the data strobe signal DQS. The buffer 12 has an output buffer 12-1 for outputting the data strobe signal and an input buffer 12-2 for receiving the data strobe signal.

With regard to output of the data strobe signal, a signal having a phase difference of 180° with respect to the internal clock signal 5 is output. In order to generate a signal having a phase difference of 180° with respect to the internal clock signal 5, use is made of a signal that is the result of reversing the polarity of the internal clock signal (Clock) 5 by an inverter circuit 32, by way of example.

The DQ external terminal 13 is connected to the bi-directional interface buffer 11.

A DQS external terminal 14 serving as a data strobe input/output terminal is connected to the bi-directional interface buffer 12. Ordinarily, a single data strobe (DQS) is required per 8-bit data (DQ [7:0]).

The circuit on the input side has a variable delay circuit 15 for applying a phase shift with respect to the data strobe signal input from the buffer 12.

The variable delay circuit 15 comprises an MDLL (Master Delay Lock Loop) for generating a delay-changeover control signal, which corresponds to the period of the internal clock, from the shift degree indicated by a phase-shift-amount signal 16 that is supplied from a normal-mode phase-shift-amount control circuit 24, and an SDLL (Slave Delay Lock Loop) which, in accordance with the delay-changeover control signal from the MDLL, adds on a delay to the data strobe signal that enters via the bi-directional interface buffer 12 and outputs the resultant signal.

The phase-shift-amount signal 16 is a signal delivered from the normal-mode phase shift amount control circuit 24 to the variable delay circuit 15 in order to set the amount of phase shift of the variable delay circuit 15 when the normal mode is in effect.

The normal-mode phase shift amount control circuit 24 includes a register (not shown) which, when the normal mode is in effect, is set to a fixed value indicating 90° or is capable of being set from a host system (not shown). The register holds the shift degree at the time of the normal mode and is capable of being set from a host apparatus such as a CPU (not shown) by software or is set from an external circuit such as a calibration circuit (not shown) that derives the optimum degree of shift.

A selector 17, which receives as inputs the output of the variable delay circuit 15 and the output signal from the input buffer 12-2 of interface buffer 12, bypasses the variable delay circuit 15 when the circuit on the output side is tested. That is, the selector 17 selects the output from the variable delay circuit 15 when the normal mode is in effect and selects the output signal from the input buffer 12-2 of the bi-directional interface buffer 12 when the circuit on the output side is subjected to a loopback test.

A signal 18 is a read-data capture clock signal selected by the selector 17. A read-data capture circuit (input-data sampling circuit) 19 includes flip-flops F/F3 and F/F4 for sampling read data, which is the input signal from the input buffer 11-2. The flip-flops F/F3 and F/F4 sample the read data in synchronization with the positive-going and negative-going edges of the read-data capture clock signal 18. It should be noted that there are also cases where the read-data capture circuit 19 has a FIFO (First In, First Out) configuration.

Write data 20 of an output source is data which is for being written to memory and is supplied from internal logic (not shown) when the normal mode is in effect. The write data 20 is supplied from a pattern generating circuit (an internal circuit), not shown when the loopback test is conducted.

Read data 21 is read data sampled by the read-data capture circuit 19. Read data (POS) and read data (NEG) represent read data sampled respectively at the positive-going (rising) edge and negative-going (falling edge) of the read-data capture clock signal 18 by the flip-flops F/F3, F/F4 in the read-data capture circuit 19.

A comparator circuit A (22) compares the output-source write data 20 (expected value) with the read data 21 captured by loopback (i.e., the comparator performs an expected-value comparison).

<Memory Access Operation>

In a case where write access to a memory (DDR SDRAM) (not shown) is performed in the DDR SDRAM controller having a loopback test function according to the prior art of FIG. 13, a signal phase-shifted by 90° with respect to the internal clock signal 5 by the variable delay circuit 6 is selected by the selector 8, the output-source write data 20 is converted to a signal having a double data rate by the data output circuit 10 in accordance with the clock signal 9 for data output of the selected signal, and the resultant signal is output to the data terminal 13 via the interface buffer 11, whence the signal is sent to the memory (not shown) side.

Further, a signal that is 180° out of phase with the internal clock signal 5 is output to the data strobe terminal 14 via the output buffer 12-1 of the interface buffer 12, whence the signal is sent to the memory (not shown) side.

On the other hand, in a case where read access from memory (not shown) is carried out, read data that has entered from the data terminal 13 is captured by the read-data capture circuit 19 via the input buffer 11-2 of the interface buffer 11. As for the read-data capture clock signal 18, a signal phase-shifted by 90° with respect to the data strobe signal (which is output from the DDR SDRAM), which enters from the DQS external terminal 14 via the buffer 12-2 of the interface buffer 12, by the variable delay circuit 15 is selected by the selector 17 and used.

<Loopback Test Technique>

At the time of the loopback test, the memory (DDR SDRAM) (not shown) is not connected to the controller and the data signal and data strobe signal, which have been output from the output buffers 11-1 and 12-1, respectively are loop backed and received by the corresponding input buffers 11-2 and 12-2, respectively, and testing of a path of the data and data strobe of the output-side circuit and input-side circuit in the controller is conducted in a manner described later.

However, in a case where the loopback test is conducted, if use is made of the signals phase-shifted by the variable delay circuits 6 and 15 of both the output-side and input-side circuits in a manner similar to that when memory access is performed, there is contention between timing of the changeover of the data and timing of the clock, and normal data capture cannot be carried out. This will be described with reference to FIG. 14. FIG. 14 is a timing waveform diagram illustrating loopback operation in a case where the variable delay circuits 6, 15 of both the output-side and input-side circuits are not bypassed. In FIG. 14, data 123, which has been imparted with a phase difference of 90° by the variable delay circuit 6 on the output side, and a data strobe 124 are output to the DQ external terminal 13 and DQS external terminal 14, respectively. However, the data strobe signal that has been looped back and input is shifted in phase by 90° in the variable delay circuit 15 on the input-side circuit. In the read-data capture circuit 19, therefore, the changeover of input data 125 and the transition edge of input clock 126 occur at the same timing (see the arrows A in FIG. 14). That is, the data changeover (Data0 to Data 1, Data2 to Data3) and the rising edge of input clock signal 126 of the read-data capture flip-flop F/F3 occur at the same timing. Similarly, data changeover (Data1 to Data 2) and the falling edge of input clock signal occur at the same timing. In the flip-flops F/F3 and F/F4 of the read-data capture circuit 19 in FIG. 13, contention with clock timing occurs and normal capture of data cannot be performed.

With the conventional loopback test method, therefore, the circuit on the output side and the circuit on the input side are tested separately. That is, when the output-side circuit is tested in FIG. 13, the selector 17 bypasses the variable delay circuit 15, and when the input-side circuit is tested, the selector 8 bypasses the variable delay circuit 6. Testing of the output-side circuit and testing of the input-side circuit will be described below.

<Testing of Output-Side Circuit>

FIG. 15 is a diagram illustrating timing waveforms when the output-side circuit is tested in the arrangement of FIG. 13. In a case where the output-side circuit is tested, a phase difference of 90° is furnished between data 127 and a data strobe 128 by the variable delay circuit 6 of the output-side circuit in a manner the same as that of the normal (normal-mode) memory-write access operation. The data 127 and data strobe 128 that have been output are looped back at the DQ external terminal 13 and DQS external terminal 14 and captured in the controller. Since the entered data 127 and data strobe 128 already have the phase difference of 90° between them, the selector 17 selects the output of the input buffer 12-2 and not the output of the variable delay circuit 15. The clock signal that has bypassed the variable delay circuit 15 is selected by the selector 17 as a clock 129 of the read-data capture circuit 19, whereby normal data capture is carried out. The flip-flop F/F3 of the read-data capture circuit 19 samples the input data (Data0, Data2) at the rising edge of the clock 129, and the flip-flop F/F4 samples the input data (Data1, Data3) at the falling edge of the clock 129.

In FIG. 13, the test of the output-side circuit is conducted by comparing the value of the output-source write data 20 and the value of the read data 21 sampled by the input-data capture circuit 19 using the comparator circuit A (22) and then confirming coincidence. At this time the read data (POS) and write data (POS) corresponding to the expected value thereof are compared, and the read data (NEG) and write data (NEG) corresponding to the expected value thereof are compared.

<Testing of Input-Side Circuit>

FIG. 16 is a diagram illustrating timing waveforms when the input-side circuit is tested in the arrangement of FIG. 13. In a case where the input-side circuit is tested, no phase difference is furnished between data 130 and a data strobe 131 at the DQ external terminal 13 and DQS external terminal 14 in a manner the same as that of the normal (normal-mode) memory-read access operation. In the output-side circuit, therefore, the selector 8 bypasses the variable delay circuit 6.

The data 130 and data strobe 131 that have been output from the DQ external terminal 13 and DQS external terminal 14, respectively, are looped back at the DQ external terminal 13 and DQS external terminal 14 and these are captured in the input-side circuit within the controller while the phase between the data 130 and data strobe 131 is kept the same.

In the input-side circuit, a signal (132 in FIG. 16) phase-shifted by 90° by the variable delay circuit 15 is selected by the selector 17 in a manner the same as that of the normal memory-read access operation, and this is used as the clock of the flip-flops F/F3 and F/F4 of the read-data capture circuit 19.

In FIG. 13, the input-side circuit can be tested by comparing the value of the write data 20 and the value of the read data 21 by the comparator circuit A (22) and then confirming coincidence. At this time the read data (POS) and write data (POS) corresponding to the expected value thereof are compared, and the read data (NEG) and write data (NEG) corresponding to the expected value thereof are compared.

By effecting operation at actual speed using the conventional loopback test method described above, it is possible to detect faults inclusive of delay faults in the setting of the 90° phase shift by the variable delay circuits of the output-side and input-side circuits.

However, in the circuit arrangement shown in FIG. 13, the selectors 8 and 17 are inserted in order to bypass the variable delay circuits 6 and 15 at the time of the loopback test. Consequently, the propagation delay time of the selectors 8 and 17 is always added to the clock path not only at the time of the loopback test but also when the normal mode is in effect. The insertion of the selectors leads to an increase in path delay and there are cases where this becomes a burden in assuring timing at the design stage. Further, since delay faults cannot be detected in a case where the amount of phase shift in a variable delay circuit is changed over finely, measurement can only be performed by a costly high-speed tester in order to test the phase changeover function.

[Patent Document 1]

Japanese Patent Kokai Publication No. JP-P2005-78547

SUMMARY OF THE INVENTION

With the conventional loopback test circuit, it is necessary to bypass the variable delay circuit 15 of the circuit on the input side in a case where the circuit on the output side is tested with the conventional loopback test circuit, and it is necessary to bypass the variable delay circuit 6 of the circuit on the output side in a case where the circuit on the input side is tested, as described above. The selectors 8 and 17 are inserted for this reason, and this leads to an increase in the delay of each clock. That is, a burden is imposed in terms of assuring timing of memory access when the normal mode is in effect (this is a first problem of the prior art). In normal memory-read access, conditional equations for assuring the timing of setup time/hold time of the flip-flops F/F3, F/F4 within the read-data capture circuit 19 are given by Equations (1) and (2) below. It is necessary that [read-data capture clock-path delay inclusive of selector] include the delay of the selector 17. Owing to this increase in delay, there is the possibility that delay variation or deterioration of duty will increase, and a burden is imposed when assuring timing for both setup time and hold time of the flip-flops F/F3, F/F4 in the read-data capture circuit 19.

$$\text{Setup (max)} < -tDQSQ(\max) + [90° \text{ phase shift}] - \qquad (1)$$
$$[\text{jitter and duty deterioration of read-data strobe}] -$$
$$[\text{cause of skew between } DQ \text{ and } DQS \text{ external to chip}] -$$
$$[\text{read-data path delay}] \times$$
$$[\text{relative variation rate of data-path delay}] +$$
$$\frac{[\text{read-clock path delay inclusive of selector}]}{[\text{relative variation rate of clock-path delay}]} \times$$

$$\text{Hold (max)} < tQH(\min) + [90° \text{ phase shift}] - \qquad (2)$$
$$[\text{jitter and duty deterioration of read-data strobe}] -$$
$$[\text{cause of skew between } DQ \text{ and } DQS \text{ external to chip}] +$$
$$[\text{read-data path delay}] \times$$
$$[\text{relative variation rate of data-path delay}] -$$
$$\frac{[\text{read-clock path delay inclusive of selector}]}{[\text{relative variation rate of clock-path delay}]} \times$$

where tDQSQ (DQS-DQ skew for DQS and associated DQ signals: skew between DQS and DQ) and tQH (DQ/DQS output hold time from DQS: data hold time) are the timing specs of the DDR SDRAM.

Further, in normal memory-write access, the DDR SDRAM has timing-spec parameters tDS (DQ and DM input setup time) and tDH (DQ and DM input hold time). Conditions for assuring these timing specs are given by Equations (3) and (4) below. It is necessary that [write-data strobe output-path delay inclusive of selector] in conditional Equations (3) and (4) include the delay of the selector 8. Owing to this increase in delay, there is the possibility that delay variation or deterioration of duty will increase, and a burden is imposed when assuring timing for both tDS and tDH.

$$tDS (\max) < [90° \text{ phase shift}] - [\text{jitter and duty deterioration of internal clock signal}] - \quad (3)$$
$$[\text{cause of skew between } DQ \text{ and } DQS \text{ external to chip}] - [$$
$$\text{write-data output-path delay}] \times [\text{relative variation rate of data path delay}] +$$
$$[\text{write-data strobe output-path delay inclusive of selector}]$$
$$\times [\text{relative variation rate of clock-path delay}]$$

$$tDH (\max) < [90° \text{ phase shift}] - [\text{jitter and duty deterioration of internal clock signal}] - \quad (4)$$
$$[\text{cause of skew between } DQ \text{ and } DQS \text{ external to chip}] + [$$
$$\text{write-data output-path delay}] \times [\text{relative variation rate of data path delay}] -$$
$$[\text{write-data strobe output-path delay inclusive of selector}] \times$$
$$[\text{relative variation rate of clock-path delay}]$$

When the circuit on the output side is tested with the conventional loopback test, as described above, the variable delay circuit 6 of the output-side circuit is set in such a manner that the data signal and data strobe signal maintain a phase difference of 90°, which is equal to that at the time of normal operation, and the variable delay circuit 15 of the input-side circuit is set in such a manner that the amount of phase shift of the data strobe is made 0° (the variable delay circuit 15 of the input-side circuit is bypassed).

Further, when the circuit on the input side is tested, the variable delay circuit 6 of the output-side circuit is changed over in such a manner that the data signal and data strobe signal take on the same phase (the variable delay circuit 6 of the output-side circuit is bypassed) and the variable delay circuit 15 of the input-side circuit is set to 90°, which is equivalent to the shift at the time of normal operation.

However, from the standpoint of detecting delay fault of each of the variable delay circuits 6 and 15, this conventional loopback test method is such that the test is conducted only in regard to a setting where the amount of phase shift is 90° or a setting of a certain fixed value at which data can be captured normally on the input side. Consequently, only a delay fault in the variable delay circuits with this setting can be detected. With the conventional loopback test method, a comprehensive delay-fault analysis of the variable delay circuits cannot be performed and it is necessary to use a high-speed tester (this is a second problem of the related art).

In the controller of a DDR SDRAM, the phase changeover of a variable delay circuit is such that a single step of a change in delay is on the order of 10 ps. The conventional method is such that if the step is changed, it is difficult to change over the delay and it is difficult to detect that the amount of delay is the appropriate amount of delay at each step.

In order to detect delay fault, therefore, it is necessary to measure a fluctuation in delay by a costly high-speed tester through an external terminal, as illustrated in FIG. 17. In order to analyze a delay fault, test patterns of data and a data strobe signal are supplied from the driver of a tester to the DQ external terminal 13 and DQS external terminal 14. Pattern delay (phase) is adjusted on the tester side and a timing margin test (AC test) is conducted. Alternatively, data and a data strobe signal from the DQ external terminal 13 and DQS external terminal 14 are captured via a comparator in the tester and a timing margin test (AC test) is conducted by sweeping comparison timing in the tester. Thus, with the conventional loopback test, analysis of delay cannot be performed and delay analysis using a high-speed tester is required.

Accordingly, an exemplary object of the present invention is to solve the problems of the prior art set forth above.

According to one aspect of the present invention, the above and other objects are attained by providing an interface circuit comprising: an output-side circuit that outputs a data signal and a data strobe signal which stipulates sampling timing of the data signal; and an input-side circuit that inputs a data signal and a data strobe signal; wherein the interface circuit complies with specifications in which phase relationships between the data signal and the data strobe signal in the data output and input take on respective ones of prescribed relationships; the output-side circuit including: a first selector, which receives as inputs a first phase shift amount signal which stipulates a phase shift amount when a normal mode is in effect and a second phase shift amount signal which stipulates a phase shift amount when a test mode is in effect, for selecting the first phase shift amount signal when the normal mode is in effect and the second phase shift amount signal when the test mode is in effect; and a first variable delay circuit, which receives a clock signal, for adding to the clock signal a delay conforming to the phase shift amount signal selected by the first selector and supplying the resultant signal to an output-data sampling circuit as a sampling clock; a signal obtained by phase-shifting the clock signal a fixed amount being output as the data strobe signal. The input-side circuit includes a second selector, which receives as inputs a third phase shift amount signal which stipulates a phase shift amount when a normal mode is in effect and a fourth phase shift amount signal which stipulates a phase shift amount when a test mode is in effect, for selecting the third phase shift amount signal when the normal mode is in effect and the fourth phase shift amount signal when the test mode is in effect; and a second variable delay circuit, which receives the data strobe signal input thereto, for adding to the data strobe signal a delay conforming to the phase shift amount signal selected by the second selector and supplying the resultant signal to an input-data sampling circuit as a sampling clock signal.

An interface circuit in accordance with another aspect of the present invention comprises: an output-side circuit that outputs a data signal and a data strobe signal which stipulates sampling timing of the data signal; and an input-side circuit that inputs a data signal and a data strobe signal; wherein the interface circuit complies with specifications in which phase relationships between the data signal and the data strobe signal in the data output and input take on respective ones of prescribed relationships; the output-side circuit including: a first selector, which receives as inputs a first phase shift amount signal which stipulates a phase shift amount when a normal mode is in effect and a second phase shift amount signal which stipulates a phase shift amount when a test mode is in effect, for selecting the first phase shift amount signal when the normal mode is in effect and the second phase shift amount signal when the test mode is in effect; and a first variable delay circuit, which receives a clock signal, for outputting, as a data strobe signal, a signal obtained by adding to the clock signal a delay conforming to the phase shift amount signal selected by the first selector; the data signal being sampled by a sampling circuit with the clock signal serving as a sampling clock. The input-side circuit includes a second selector, which receives as inputs a third phase shift amount signal which stipulates a phase shift amount when a normal mode is in effect and a fourth phase shift amount signal which stipulates a phase shift amount when a test mode is in effect, for selecting the third phase shift amount signal when the normal mode is in effect and the fourth phase shift amount signal when the test mode is in effect; and a second variable delay circuit, which receives the data strobe signal input thereto, for adding to the data strobe signal a delay conforming to the phase shift amount signal selected by the second selector and supplying the resultant signal to an input-data sampling circuit as a sampling clock signal.

In the present invention, the interface circuit further comprises: a first comparator circuit for comparing, as expected values, input data sampled by the input-side circuit and output data corresponding to the input data at the time of a loopback test in which the data signal and data strobe signal, which have been output from respective output buffers, are looped back and enter from respective corresponding input buffers; and a second comparator circuit for comparing, as expected values, the input data and output data the sampling timing of which differs from that of the input data.

In the present invention, the output-side circuit further includes: a first normal-mode phase shift amount control circuit for outputting the first phase shift amount signal; and a first test-mode phase shift amount control circuit for outputting the second phase shift amount signal; and the input-side circuit further includes: a second normal-mode phase shift amount control circuit for outputting the third phase shift amount signal; and a second test-mode phase shift amount control circuit for outputting the fourth phase shift amount signal; wherein the first and second normal-mode phase shift amount control circuits and the first and second test-mode phase shift amount control circuits each have a register for setting and storing a respective phase shift amount fixedly or variably.

In the present invention, the first and second variable delay circuits each include a delay locked loop circuit.

In the present invention, delay analysis is performed by varying the amount of delay by the second and fourth phase shift amounts selected by said first and second selectors, respectively, at the time of the loopback test.

An interface circuit in accordance with further aspect of the present invention comprises: an output-side circuit that outputs a data signal and a data strobe signal which stipulates sampling timing of the data signal; and an input-side circuit that inputs a data signal and a data strobe signal; wherein the interface circuit complies with specifications in which phase relationships between the data signal and the data strobe signal in the data output and input take on respective ones of prescribed relationships; the output-side circuit including: a sampling circuit for sampling and outputting the data signal at a clock obtained by frequency-multiplying a clock signal; a signal obtained by phase-shifting the clock signal a fixed amount being output as the data strobe signal; the input-side circuit including: a first selector, which receives as inputs a first phase shift amount signal which stipulates a phase shift amount when a normal mode is in effect and a second phase shift amount signal which stipulates a phase shift amount when a test mode is in effect, for selecting the first phase shift amount signal when the normal mode is in effect and the second phase shift amount signal when the test mode is in effect; and a first variable delay circuit, which receives the data strobe signal input thereto, for supplying a signal, which is obtained by adding to the data strobe signal a delay conforming to the phase shift amount signal selected by the first selector, to an input-data sampling circuit as a sampling clock signal.

In the present invention, the output-side circuit includes a second selector, which receives as inputs a third phase shift amount signal which stipulates a phase shift amount when a normal mode is in effect and a fourth phase shift amount signal which stipulates a phase shift amount when a test mode is in effect, for selecting the third phase shift amount signal when the normal mode is in effect and the fourth phase shift amount signal when the test mode is in effect; and a second variable delay circuit, which receives the frequency-multiplied clock signal, for outputting, as a data strobe signal, a signal obtained by adding to the clock signal a delay conforming to the phase shift amount signal selected by the second selector.

In the present invention, the interface circuit further comprises: a first comparator circuit for comparing, as expected values, input data sampled by the input-side circuit and output data corresponding to the input data at the time of a loopback test in which the data signal and data strobe signal, which have been output from respective output buffers, are looped back and enter from respective corresponding input buffers; and a second comparator circuit for comparing, as expected values, the input data and output data the sampling timing of which differs from that of the input data.

In accordance with the present invention, a semiconductor device having the above-described interface circuit is provided.

In accordance with the present invention, there is provided a memory controller having the above-described interface circuit, the controller inputting and outputting data and a data strobe signal to and from a clock-synchronized memory. When the normal mode is in effect, the data signal that is output is write data to the memory, the input data is read data from the memory, the data strobe signal that is output is a data strobe signal to the memory, and the data strobe signal that is input is a data strobe signal from the memory; the clock signal is a clock signal having a frequency identical with that of a clock that drives the memory; and when the loopback test mode is in effect, an output terminal and an input terminal of the data signal are connected and an output terminal and an input terminal of the data strobe signal are connected.

The meritorious effects of the present invention are summarized as follows.

In accordance with the present invention, selectors for bypassing variable delay circuits, which are used in the conventional circuits, are no longer required, and the burden in terms of assuring timing of memory access in the normal mode is alleviated. When a test is conducted, a test to detect delay faults in an operation performed at actual speed is achieved.

Further, in accordance with the present invention, it is possible to conduct a loopback test without using a high-speed tester in order to detect delay fault in the phase-shift function of a variable delay circuit.

Other features and advantages of the present invention will be apparent from the following description taken in conjunction with the accompanying drawings, in which like reference characters designate the same or similar parts throughout the figures thereof.

EXAMPLES OF THE INVENTION

Figure 1:
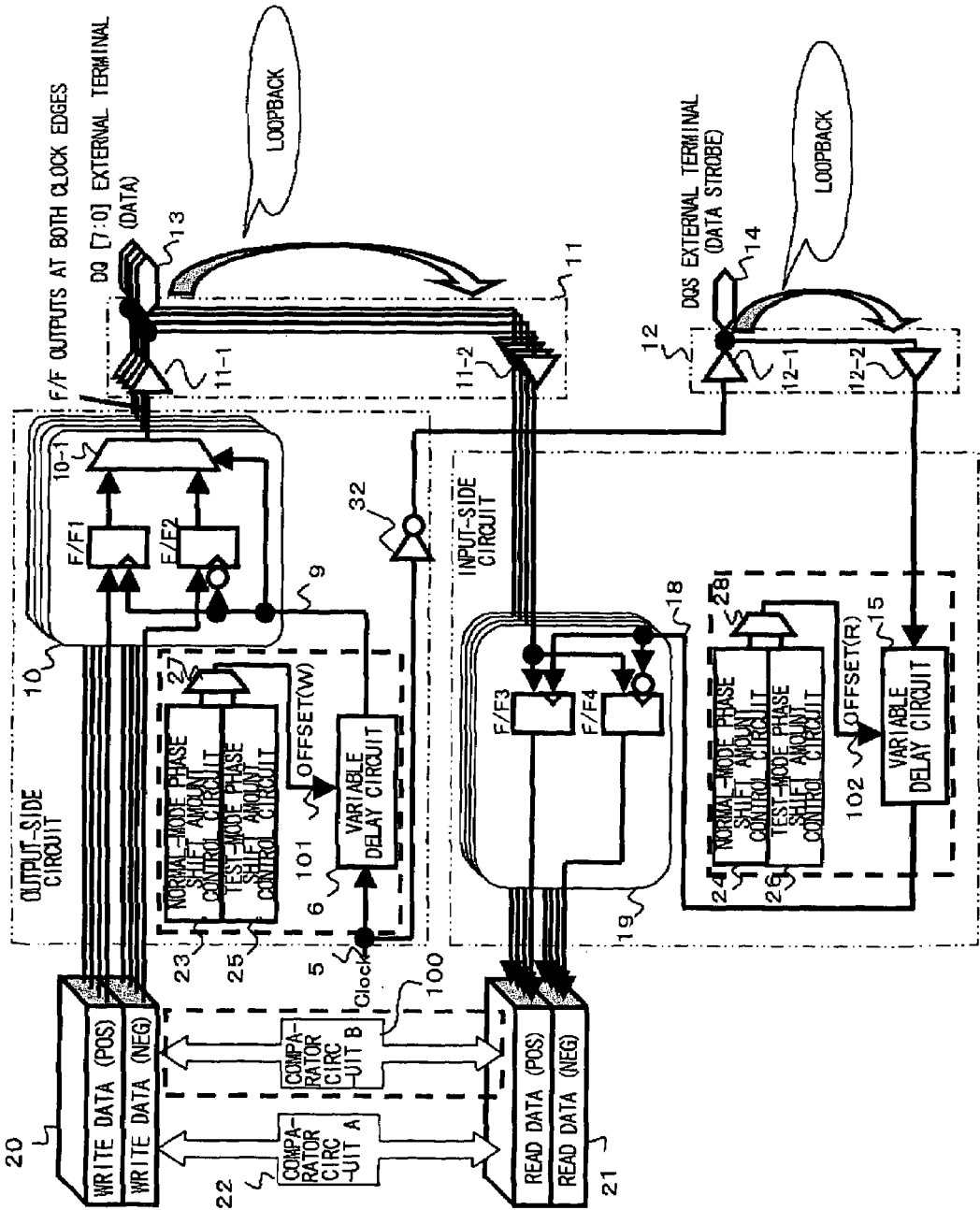
FIG. 1 is a diagram illustrating the configuration of a first example of the present invention.

Examples of the present invention will now be described in detail with reference to the drawings.

In the present invention, there is provided an interface circuit comprising: an output-side circuit that outputs a data signal and a data strobe signal which stipulates sampling timing of the data signal; and an input-side circuit that inputs a data signal and a data strobe signal. The interface circuit complies with predetermined specifications in which phase relationships between the data signal and the data strobe signal in the data output and input take on respective ones of prescribed relationships. The output-side circuit includes: a first selector (27), which receives as inputs a first phase shift amount signal from a first phase shift amount control circuit (23) stipulating a phase shift amount when a normal mode is in effect and a second phase shift amount signal from a second phase shift amount control circuit (25) stipulating a phase shift amount when a test mode is in effect, for selecting the first phase shift amount signal when the normal mode is in effect and the second phase shift amount signal when the test mode is in effect; and a first variable delay circuit (6), which receives a clock signal, for adding to the clock signal a delay conforming to the phase shift amount signal (101) selected by the first selector (27) and supplying the resultant signal to an output-data sampling circuit (10) as a sampling clock. A signal obtained by phase-shifting the clock signal a fixed amount is output as the data strobe signal. In the present invention, the input-side circuit includes a second selector (28), which receives as inputs a third phase shift amount signal from a third phase shift amount control circuit (24) stipulating a phase shift amount when a normal mode is in effect and a fourth phase shift amount signal from a fourth phase shift amount control circuit (26) stipulating a phase shift amount when a test mode is in effect, for selecting the third phase shift amount signal when the normal mode is in effect and the fourth phase shift amount signal when the test mode is in effect; and a second variable delay circuit (15), which receives the data strobe signal input thereto, for adding to the data strobe signal a delay conforming to the phase shift amount signal (102) selected by the second selector (28) and supplying the resultant signal to an input-data capture circuit (19) as a sampling clock signal. Alternatively, it may be so arranged that the phase of the sampling clock of output-data sampling circuit (10) is fixed and the first variable delay circuit (6) variably controls the phase shift of the data strobe signal.

First Example

Figure 13:
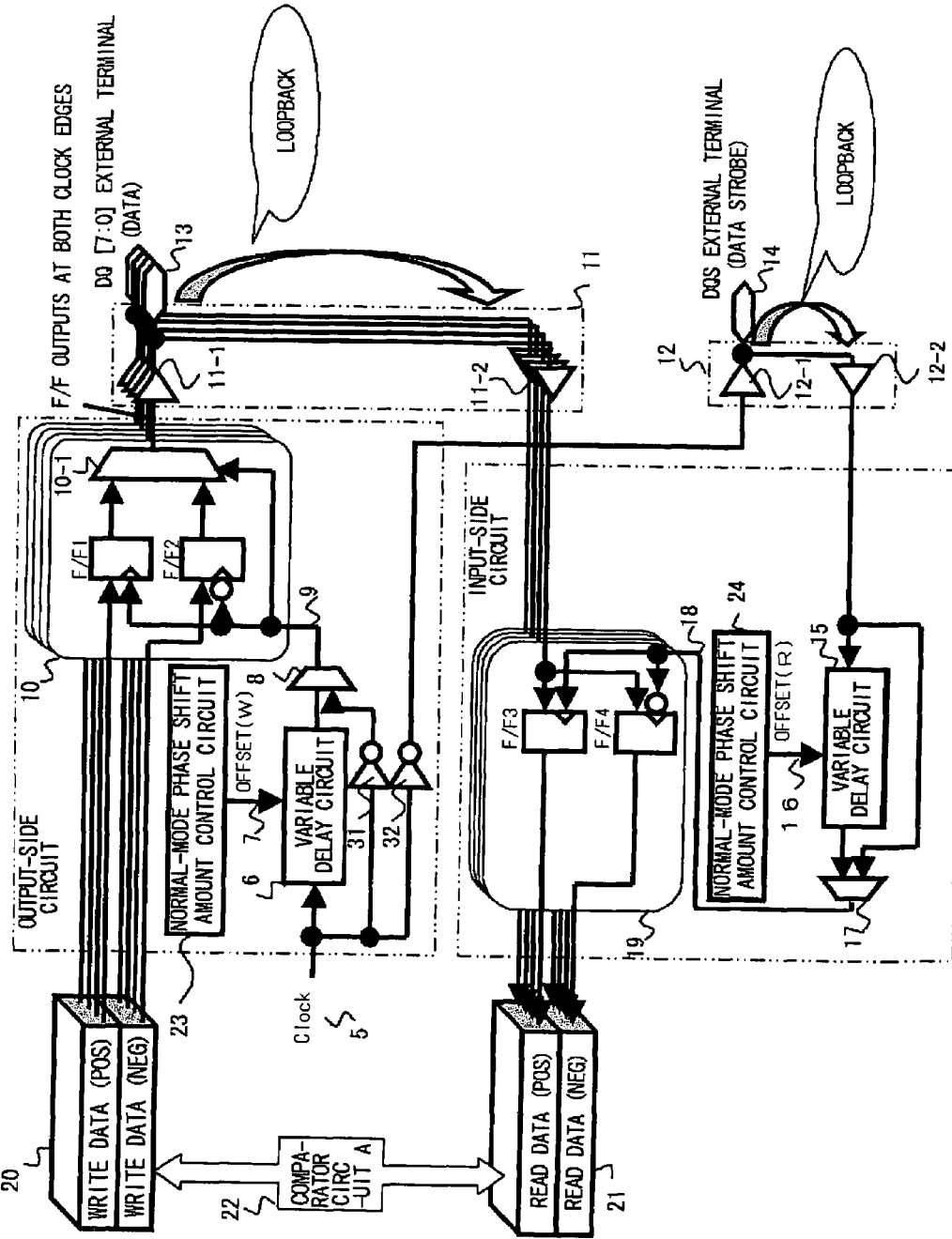
FIG. 13 is a diagram illustrating the typical configuration of a conventional DDR SDRAM controller having a loopback test function.
Figure 14:
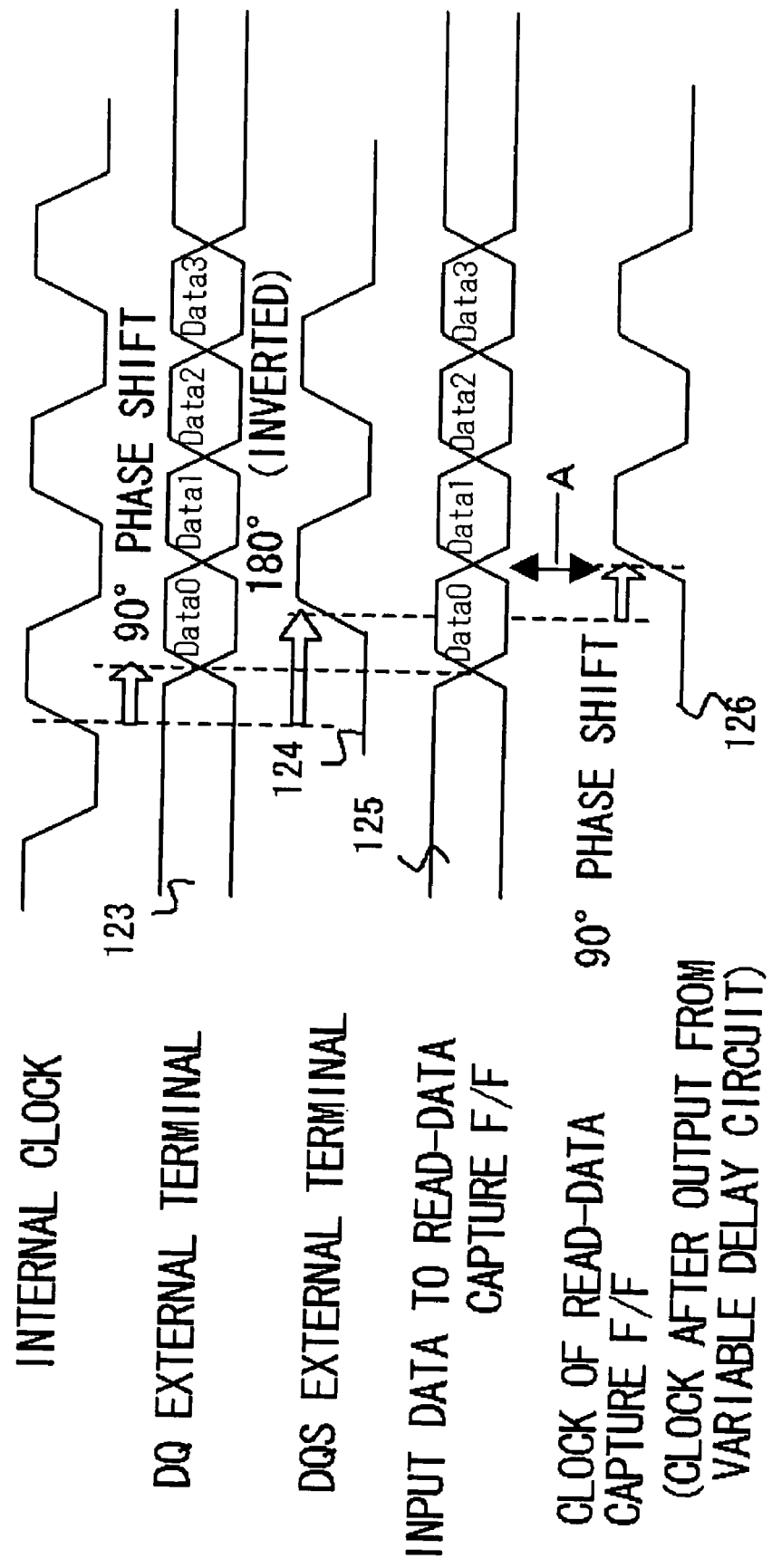
FIG. 14 is a diagram illustrating timing waveforms of a loopback test operation in a case where both variable delay circuits are not bypassed in FIG. 13.
Figure 15:
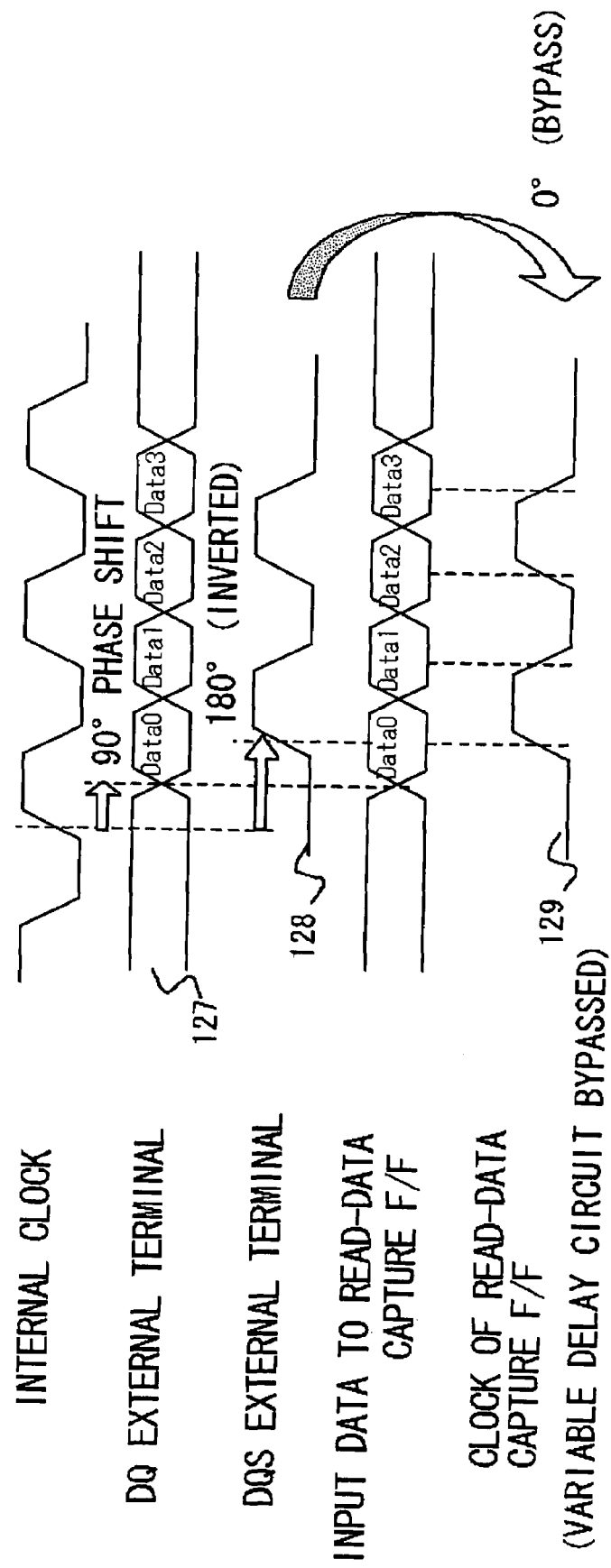
FIG. 15 is a diagram illustrating timing waveforms of the test operation of an output-side circuit using loopback in FIG. 13.
Figure 16:
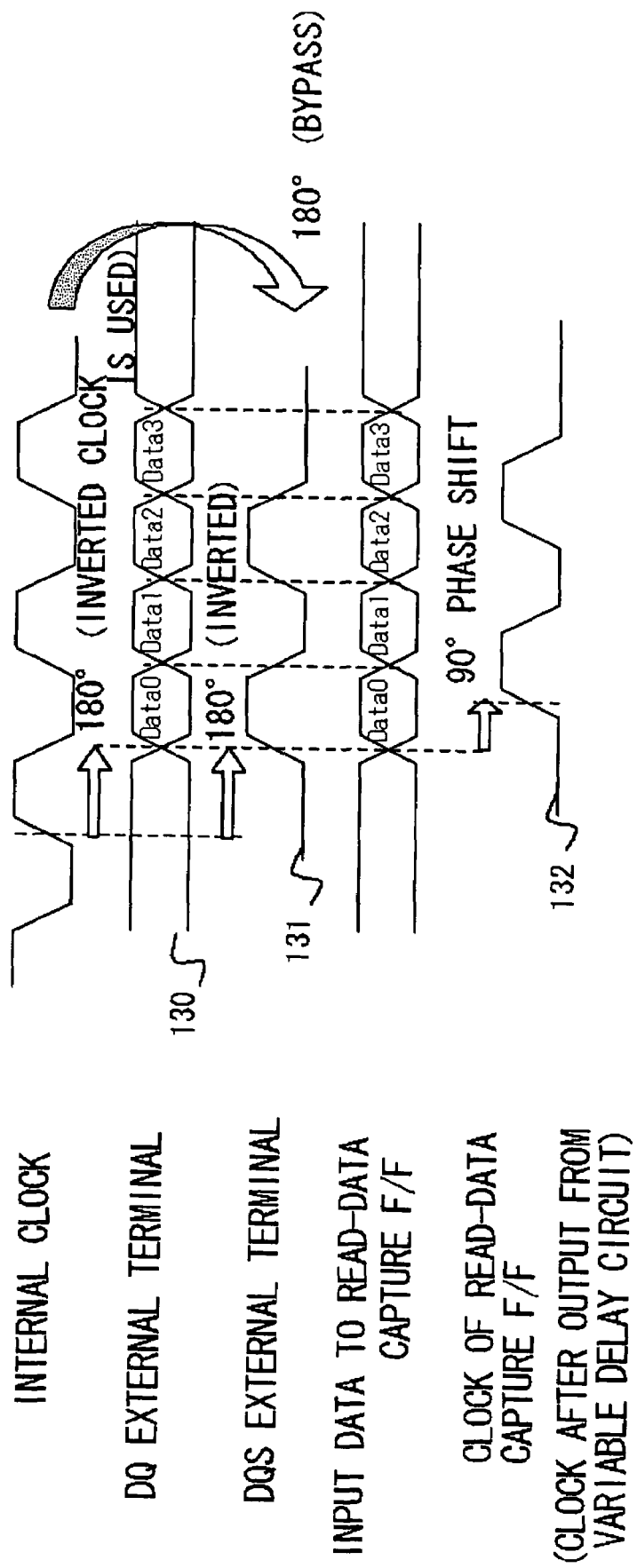
FIG. 16 is a diagram illustrating timing waveforms of the test operation of an input-side circuit using loopback in FIG. 13.
Figure 17:
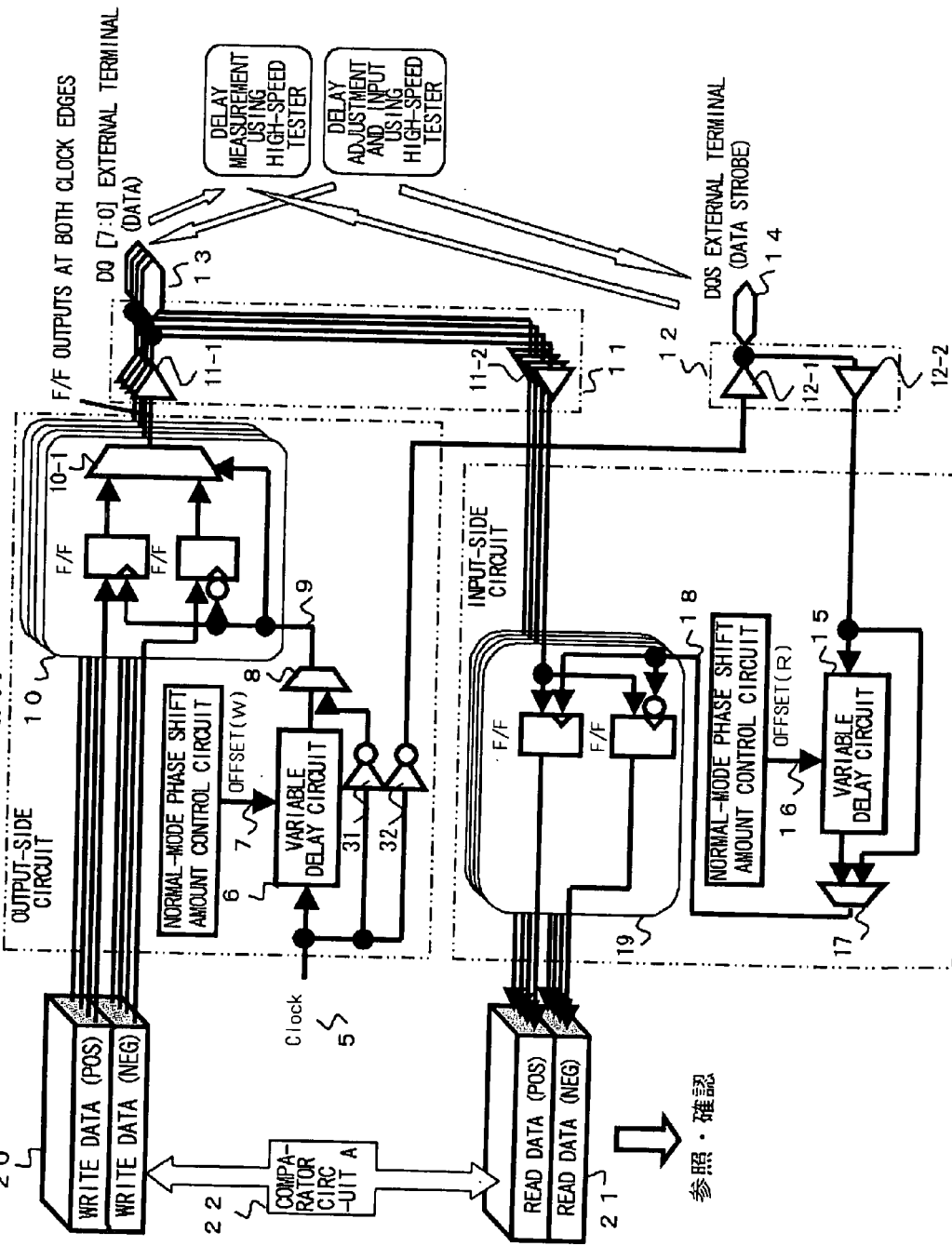
FIG. 17 is a diagram useful in describing detection of a delay fault in a variable delay circuit.

FIG. 1 is a diagram illustrating the configuration of a first example of the present invention. Structural elements in FIG. 1 identical with those shown in FIG. 13 are designated by like reference characters. Primarily the differences between this example and the conventional circuit arrangement of FIG. 13 will be described, and identical elements will not be described where appropriate in order to avoid prolixity.

As shown in FIG. 1, an output-side circuit in the first example of the present invention includes the normal-mode phase shift amount control circuit 23; a test-mode phase shift amount control circuit 25; a selector 27; and the variable delay circuit 6 for supplying a signal, which is obtained by adding a delay to the internal clock signal (Clock) 5 in accordance with the amount of phase shift selected by the selector 27, to the write-data sampling circuit 10 (flip-flops F/F1, F/F2) as a sampling clock. A signal (a signal phase-shifted by 180°) obtained by inverting the internal clock signal (Clock) 5 by the inverter circuit 32 is supplied to the output buffer 12-1 as the data strobe signal.

Further, an input-side circuit in the first example of the present invention includes the normal-mode phase shift amount control circuit 24; a test-mode phase shift amount control circuit 26; a selector 28; and the variable delay circuit 15 for supplying a signal, which is obtained by adding a delay to the entered data strobe signal in accordance with the amount of phase shift selected by the selector 28, to the read-data capture circuit 19 (flip-flops F/F3, F/F4) as the sampling clock.

The first example of the present invention further includes, in addition to the comparator circuit A (22) for comparing the output-source write data 20 with the captured read data 21 as is, a comparator circuit B (100) for performing an expected-value comparison assuming a case where capture of the read data is delayed by an amount equivalent to one edge of the data strobe.

The test-mode phase shift amount control circuits 25, 26 each comprise a register for holding a set value of shift degree at the time of a test. The register is set from an external terminal (not shown) of a DDR SDRAM controller or is set directly from the tester. On the other hand, the normal-mode phase shift amount control circuits 23, 24 each comprise a register which, when the normal mode is in effect, is capable of being set to a fixed value or to a value from a host system. The register holds the shift degree at the time of the normal mode. The register is capable of being set from a host apparatus by software or is set from an external circuit such as a calibration circuit (not shown) that derives the optimum degree of shift. Although there is no particular limitation, the variable delay circuits 6 and 15 each construct a phase shift circuit and each comprises an MDLL (Master Delay Lock Loop) and an SDLL (Slave Delay Lock Loop). The MDLL discriminates the amount of delay from the degree of a shift, which is indicated by a phase shift amount signal, and generates a delay-changeover control signal corresponding to the period of the internal clock signal (Clock) 5. In accordance with the delay-changeover control signal from the MDLL, the SDLL adds on a delay. The delay is added to the internal clock signal in the SDDL of variable delay circuit 6 and to the data strobe signal DQS in the SDDL of variable delay circuit 15. It should be noted that if a circuit in which the amount of phase shift can be varied based upon a control signal is used, then the invention is not limited to DLL and a synchronous mirror delay or the like having a delay circuit string for measuring clock period and a delay circuit string for reproducing the period may of course be used as the variable delay circuit 15.

Figure 2A:
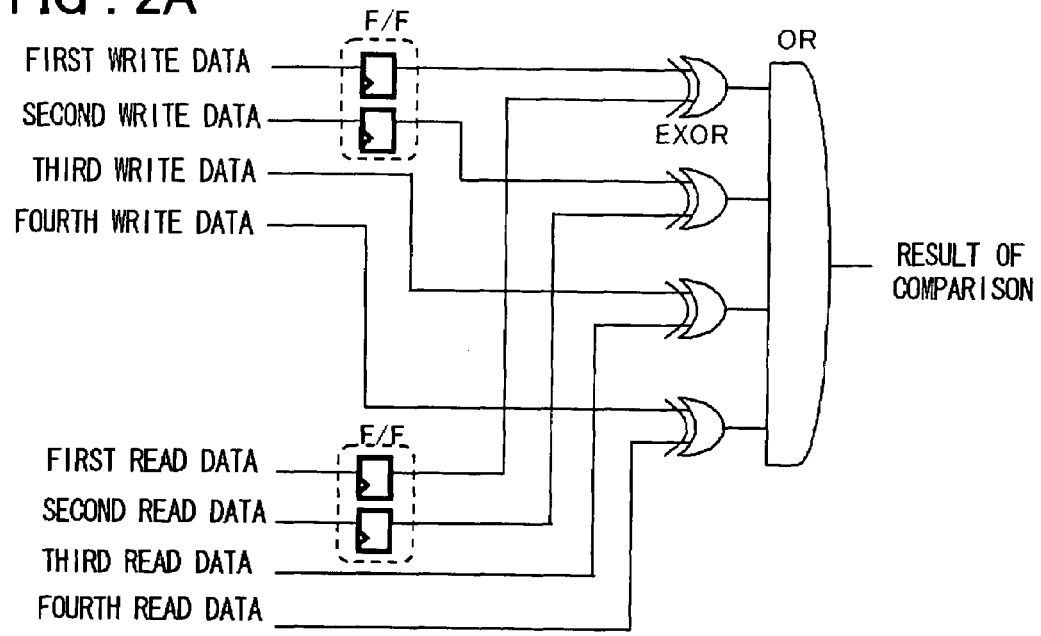
FIGS. 2A and 2B are diagrams useful in describing a comparator circuit A and a comparator circuit B, respectively, shown in FIG. 1.
Figure 2B:
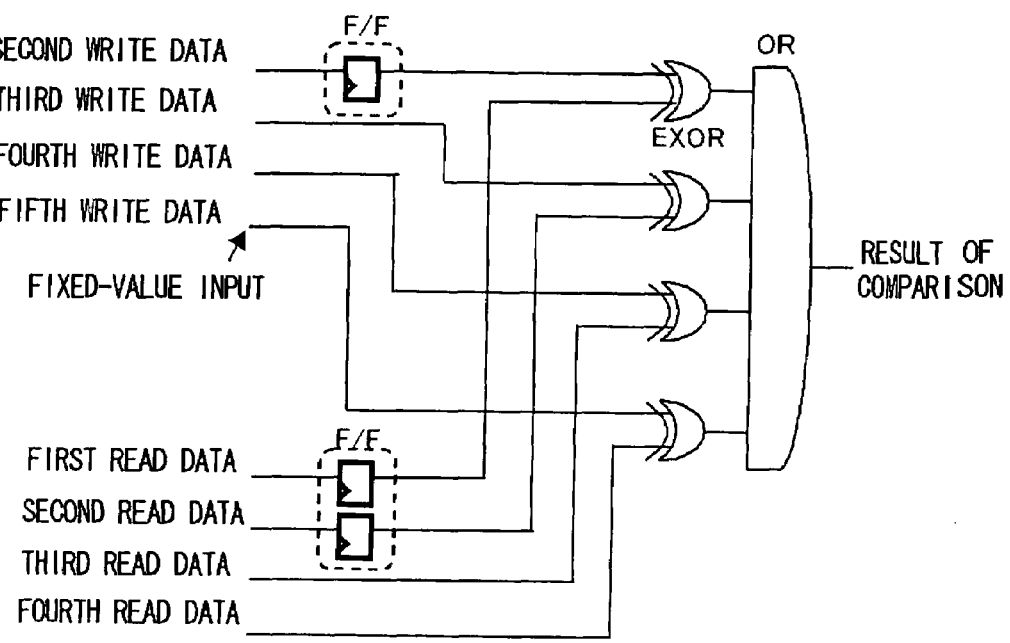

FIGS. 2A and 2B are diagrams useful in describing the structures of comparator circuit A (22) and comparator circuit B (100), respectively. As illustrated in FIG. 2A, in a case where four items of data are compared, the comparator circuit A includes four exclusive-OR (EXOR) gates and an OR gate OR. The four EXOR gates constitute coincidence detection circuits for detecting coincidence between first to fourth write data and respective ones of first to fourth read data. The OR gate outputs the OR of the outputs of the four EXOR gates as the result of the comparison. When even one of the four EXOR gates detects non-coincidence, logical "1" is output as the result of the comparison. It should be noted that the configuration of the comparator circuit naturally is not limited to that shown in FIG. 2A. The comparator circuit may employ exclusive-NOR (EXNOR) gates to construct the coincidence detection circuits. In such case the OR gate would be replaced with an AND gate and logical "0" would be output as the result of the comparison when even one EXNOR gate detects non-coincidence. It should be noted that flip-flops (F/F) inserted in the first and second write data and in the first and second read data are re-timing registers and perform a timing adjustment for comparing the first to fourth write data and the first to fourth read data in parallel and in unison in sync with a certain timing. The configuration of comparator circuit B, on the other hand, is as illustrated in FIG. 2B in a case where four items of data are compared. Here the comparator circuit B compares second write data, third write data, fourth write data and fifth write data (a fixed value) with respective ones of first to fourth read data. The write data is data that has been delayed by an amount equivalent to one edge of the data strobe signal (one data cycle) relative to the read data.

In this example, the phase shift amount signal applied to the variable delay circuit 6 of the output-side circuit is not the phase shift amount signal 7 (see FIG. 13) that prevails when the normal mode is in effect in the prior art. Instead, the output of the normal-mode phase shift amount control circuit 23 or the output of the test-mode phase shift amount control circuit 25 is selected by the selector 27 and a signal [OFFSET (W)] 101 that is capable of being changed over between the normal mode and test mode is output from the selector 27 and this signal is applied as the phase shift amount signal. It should be noted that the normal-mode phase shift amount control circuit 23 may have the same structure as that of the conventional circuit shown in FIG. 13. The test-mode phase shift amount control circuit 25, however, has a register structure that is capable of being set externally as by a tester in order to make possible control for conducting a loopback test in which the amount of phase shift is finely varied, as indicated by an example of order of evaluation, described later.

Further, in this example, it is unnecessary to bypass the variable delay circuit 6 in the output-side circuit owing to an evaluation method, described later. This means that it is no longer necessary to provide a selector (8 in FIG. 13) that bypasses the variable delay circuit 6 in the output-side circuit. The use of such a selector leads to a deterioration in characteristics.

In this example, the phase shift amount signal applied to the variable delay circuit 15 of the input-side circuit is not the phase shift amount signal 16 (see FIG. 13) that prevails when the normal mode is in effect in the prior art. Instead, the output of the normal-mode phase shift amount control circuit 24 or the output of the test-mode phase shift amount control circuit 26 is selected by the selector 28 and a signal [OFFSET (R)] 102 that is capable of being changed over between the normal mode and test mode is output from the selector 28 and this signal is applied as the phase shift amount signal. The normal-mode phase shift amount control circuit 24 may have the same structure as that of the conventional circuit shown in FIG. 13. The test-mode phase shift amount control circuit 26, however, has a register structure that is capable of being set externally as by a tester in order to make possible control for conducting a loopback test in which the amount of phase shift is finely varied, as indicated by an example of order of evaluation, described later.

Further, in this example, it is unnecessary to bypass the variable delay circuit 15 in the output-side circuit owing to an evaluation method, described later. This means that it is no longer necessary to provide a selector (17 in FIG. 13) that bypasses the variable delay circuit 6 in the output-side circuit. The use of such a selector leads to a deterioration in characteristics.

In this example, the following three cases arise as results of the comparisons in the comparator circuit A (22) and comparator circuit B (100) by varying the set values of the phase shifts 101 and 102 of variable delay circuit 6 in the output-side circuit and variable delay circuit 15 in the input-side circuit, respectively.

<Case 1>

Figure 3:
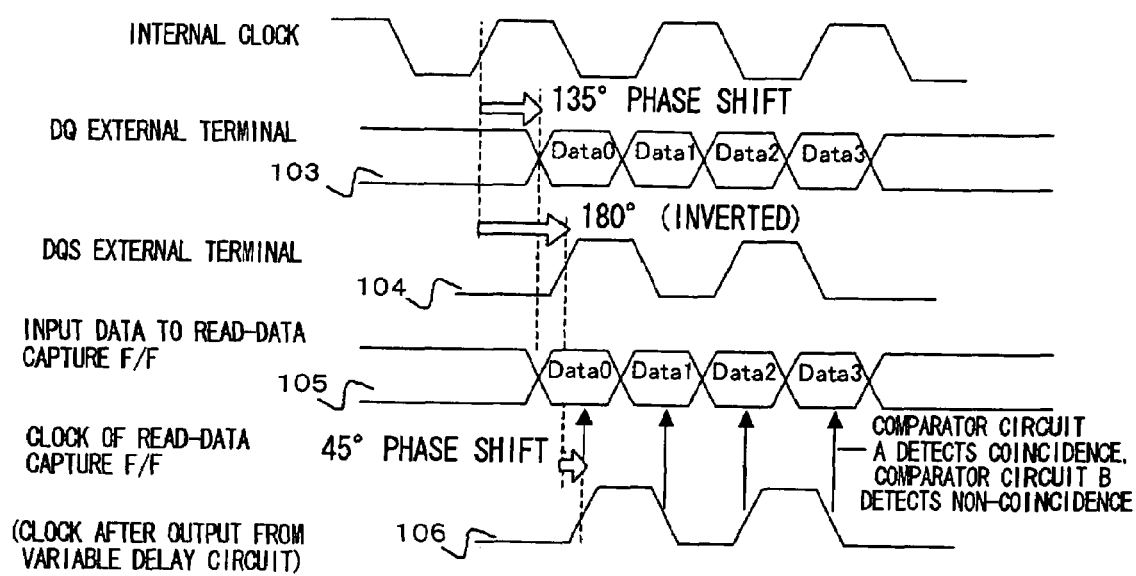
FIG. 3 is a timing waveform diagram useful in describing a Case 1 (coincidence in comparator circuit A and non-coincidence in comparator circuit B) in comparator circuits according to the first example.

FIG. 3 illustrates an example of a case where the phase shift 101 of the output-side circuit is greater than the phase shift 102 of the input-side circuit. Here it is assumed that the phase shifts of the output-side circuit and input-side circuit are 135° and 45°, respectively. In this case, the phase difference between data 103 and a data strobe 104 at the DQ external terminal 13 and DQS external terminal 14 becomes 45° owing to the variable delay circuit 6 in the output-side circuit. Furthermore, since a phase shift of 45° is performed by the variable delay circuit 15 in the input-side circuit with respect to the data strobe 104 at the DQS external terminal, the phase difference between input data 105 of the read-data capture circuit 19 and clock 106 becomes 90° and capture is performed normally. Accordingly, in a case where Data0, Data1, Data2 and Data3 has been applied as write data 20 in the order mentioned, read data 21 captured by the read-data capture circuit 19 becomes Data0, Data1, Data2 and Data3 in the order mentioned. Comparator A (22) detects coincidence and comparator B (100) detects non-coincidence.

<Case 2>

Figure 4:
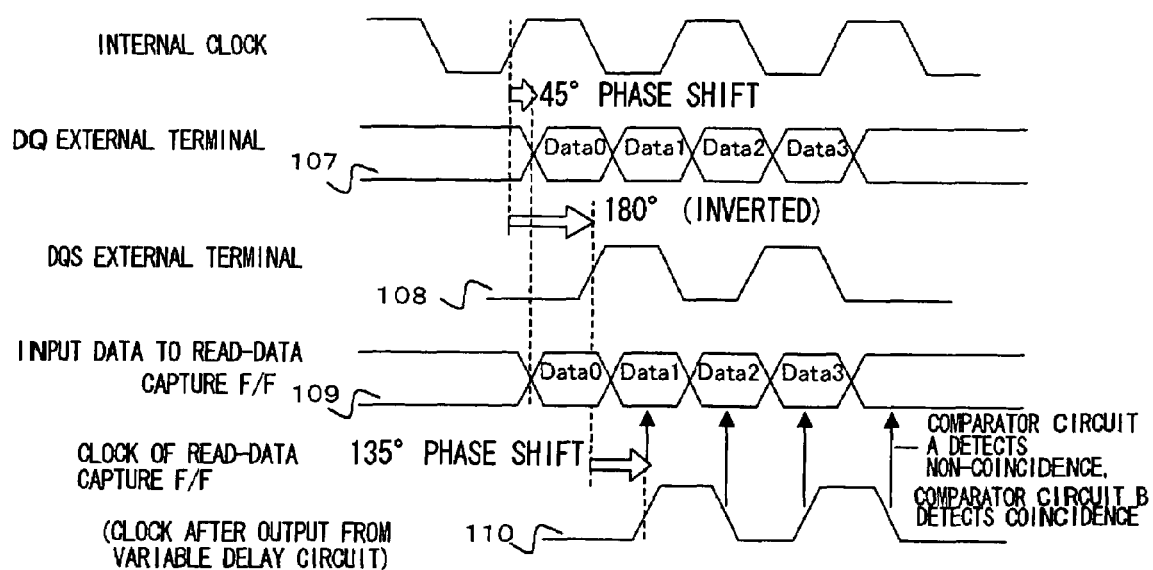
FIG. 4 is a timing waveform diagram useful in describing a Case 2 (non-coincidence in comparator circuit A and coincidence in comparator circuit B) in comparator circuits according to the first example.

FIG. 4 illustrates an example of a case where the degree indicated by the phase shift amount signal 101 of the output-side circuit is smaller than the degree indicated by the phase shift amount signal 102 of the input-side circuit. Here it is assumed that the phase shift of the variable delay circuit 6 in the output-side circuit and the phase shift of the variable delay circuit 15 in the input-side circuit are 45° and 135°, respectively. In this case, the phase difference between data 107 and a data strobe 108 at the DQ external terminal 13 and DQS external terminal 14 becomes 135° owing to the variable delay circuit 6 in the output-side circuit.

Furthermore, since a phase shift of 135° is performed by the variable delay circuit 15 in the input-side circuit with respect to the data strobe 108 at the DQS external terminal, the phase difference between input data 109 of the read-data capture circuit 19 and clock 110 becomes 270°. Data offset by one is captured normally. Consequently, if Data0, Data1, Data2 and Data3 is output, the read data 21 that is captured by the read-data capture circuit 19 becomes Data1, Data2, Data3 and Undefined, in the order mentioned. Comparator A (22) detects non-coincidence and comparator B (100) detects coincidence.

<Case 3>

Figure 5:
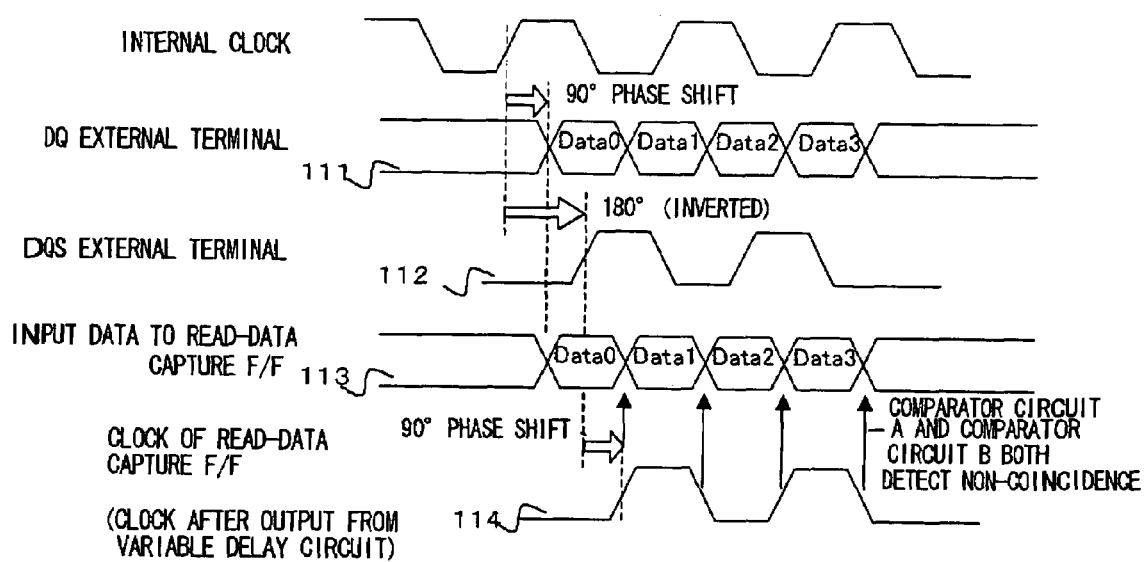
FIG. 5 is a timing waveform diagram useful in describing a Case 3 (non-coincidence in both comparator circuit A and comparator circuit B) in comparator circuits according to the first example.

FIG. 5 illustrates an example of a case where the degree indicated by the phase shift amount signal 101 of the output-side and the degree indicated by the phase shift amount signal 102 of the input-side circuit are the same. Here it is assumed that the phase shift of the variable delay circuit 6 in the output-side circuit is 90° and the phase shift of the variable delay circuit 15 in the input-side circuit is 90°. In this case, the phase difference between data 11 and a data strobe 112 at the DQ external terminal 13 and DQS external terminal 14 becomes 90° owing to the variable delay circuit 6 in the output-side circuit. Furthermore, since a phase shift of 135° is performed by the variable delay circuit 15 in the input-side circuit with respect to the data strobe 108 at the DQS external terminal, the phase difference between input data 109 of the read-data capture circuit 19 and clock 110 becomes 270°. Furthermore, since a phase shift of 90° is performed by the variable delay circuit 15 in the input-side circuit with respect to the data strobe 112 at the DQS external terminal, the phase difference between input data 113 of the read-data capture circuit 19 and clock 114 becomes 180°. Since overlap (contention) occurs between the timing at which the data changes over and the timing of the edges of the clock, normal data is not captured. Accordingly, comparator A (22) and comparator B (100) both detect non-coincidence.

Thus, in accordance with this example, it is no longer necessary to provide selectors for bypassing the variable delay circuits 6, 15 of the output- and input-side circuits, respectively. As a result, the characteristics of the clock paths are no longer degraded, burden in terms of assuring timing at the design stage is alleviated, designing is made more efficient and performance is improved.

That is, in FIG. 1, there is no longer need to provide a selector (8 in FIG. 13) for bypassing the variable delay circuit 6 in the output-side circuit. As a result, in conditional Equations (5), (6) of the timing specs of tDS and tDH, it is no longer necessary to add a delay commensurate with the selector to [write-data strobe output-path delay], unlike the case with the conventional method. Consequently, delay variation or deterioration of duty that accompanies this amount of delay no longer occurs and the burden involved in assuring the timing of tDS and tDH is mitigated.

$$tDS\,(\text{max}) < [90° \text{ phase shift}] - \qquad (5)$$
$$[\text{jitter and duty deterioration of internal clock signal}] -$$
$$[\text{cause of skew between } DQ \text{ and } DQS \text{ external to chip}] -$$
$$[\text{write-data output-path delay}] \times$$
$$[\text{relative variation rate of data path delay}] +$$
$$[\text{write-data strobe output-path delay}] \times$$
$$[\text{relative variation rate of clock path delay}]$$

$$tDH\,(\text{max}) < [90° \text{ phase shift}] - \qquad (6)$$
$$[\text{jitter and duty deterioration of internal clock signal}] -$$
$$[\text{cause of skew betweeen } DQ \text{ and } DQS \text{ external to chip}] +$$
$$[\text{write-data output-path delay}] \times$$
$$[\text{relative variation rate of clock path delay}]$$

In the input-side circuit, there is no longer need to provide a selector (17 in FIG. 13) for bypassing the variable delay circuit 15. As a result, in conditional Equations (7) and (8) of the Setup/Hold timing specs of flip-flops F/F3 and F/F4 in read-data capture circuit 19, it is no longer necessary to add a delay commensurate with the selector to [path delay in sampling clock of read-data], unlike the case with the conventional method. Consequently, delay variation or deterioration of duty that accompanies this amount of delay no longer occurs and the burden involved in assuring the timing of Setup and Hold of the capture flip-flops is mitigated.

$$\text{Setup (max)} < -tDQSQ\,(\text{max}) + [90° \text{ phase shift}] - \qquad (7)$$
$$[\text{jitter and duty deterioration of read} - \text{data strobe}] -$$
$$[\text{cause of skew between } DQ \text{ and } DQS \text{ external to chip}] -$$
$$[\text{read-data path delay}] \times$$
$$[\text{relative variation rate of data-path delay}] +$$
$$\frac{[\text{read-clock path delay inclusive of selector}]}{[\text{relative variation rate of clock-path delay}]} \times$$

-continued $$\begin{aligned}\text{Hold(max)} < tQH \text{ (min)} + &[90° \text{ phase shift}] - \\ &[\text{jitter and duty deterioration of read-data strobe}] - \\ &[\text{cause of skew between } DQ \text{ and } DQS \text{ external to chip}] + \\ &[\text{read-data path delay}] \times \\ &[\text{relative variation rate of data-path delay}] - \\ &\frac{[\text{read-clock path delay inclusive of selector}]}{[\text{relative variation rate of clock-path delay}]} \times \end{aligned} \quad (8)$$

Figure 6:
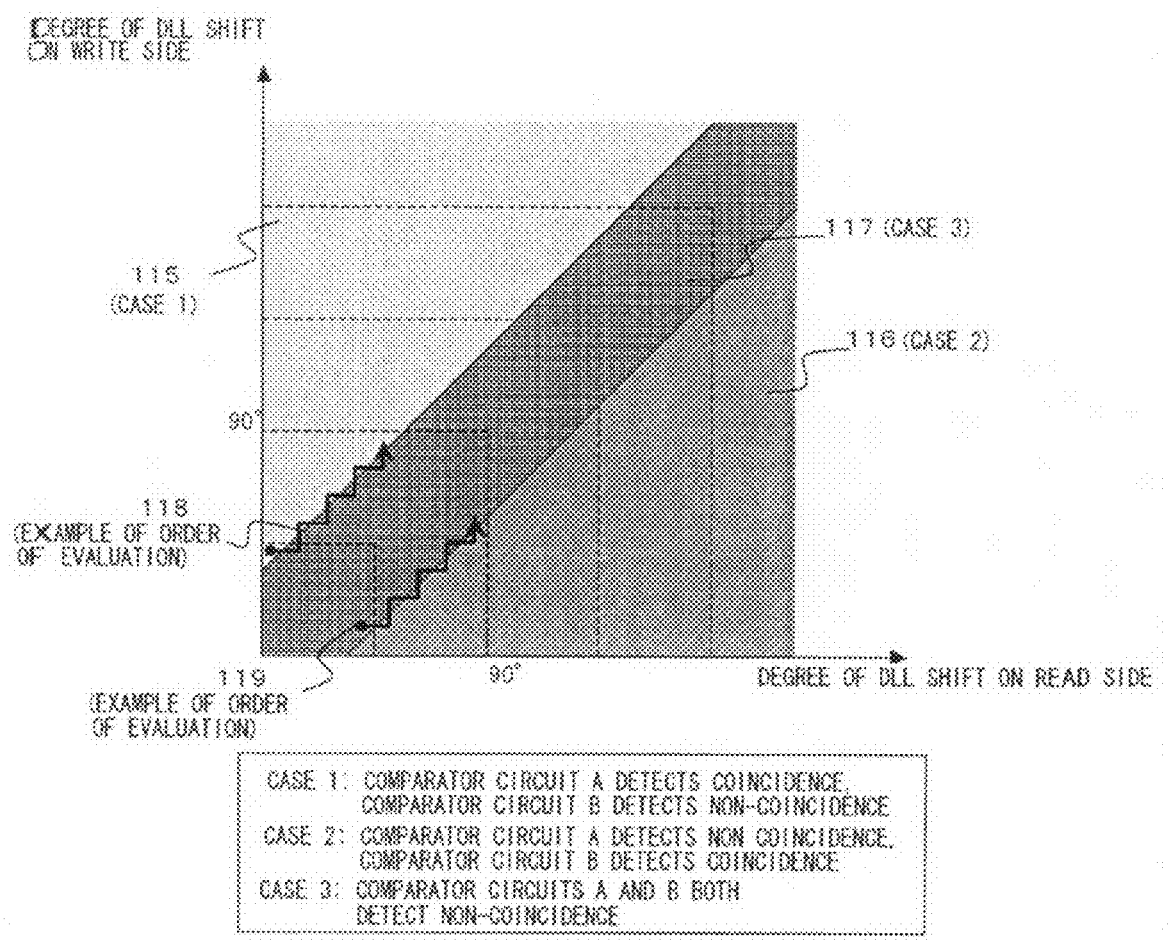
FIG. 6 is a diagram illustrating the relationship between set values of amounts of phase shift and results of comparison in the first example.

Thus, three cases (Cases 1, 2, 3) arise as the results of comparisons in the comparator circuit A (22) and comparator circuit B (100) by changing the set values of the phase shift amount signals 101, 102 of variable delay circuit 6 in the input-side circuit and variable delay circuit 15 in the output-side circuit. The relationship among these three cases is as illustrated in FIG. 6. In FIG. 6, degree of DLL shift on the read side plotted along the horizontal axis indicates the amount of phase shift of the variable delay circuit 15 in the input-side circuit. Degree of DLL shift on the write side plotted along the vertical axis indicates the amount of phase shift of the variable delay circuit 6 in the output-side circuit.

In FIG. 6, if it can be confirmed that a boundary between Case 1 (115) and Case 3 (117) and a boundary between Case 2 (116) and Case 3 (117) appear while the phase shift amount signals of the output-side circuit and input-side circuit are varied in single-step units (one degree of shift), as indicated by the arrows of examples 118, 119 indicating the order of evaluation, then it will be possible to detect a delay fault in the variable delay circuits 6, 15 within the range in which each phase shift amount signal is capable of being set. According to example 118 of order of evaluation, if the amount of phase shift of variable delay circuit 15 in the input-side circuit is retarded by one step (equivalent to one degree unit) from Case 1, then Case 3 is reached. If the amount of phase shift of the variable delay circuit 15 in the input-side circuit is kept the same and the amount of phase shift of the variable delay circuit 6 in the output-side circuit is retarded by one step (equivalent to one degree unit), then Case 1 is reached. Now if the amount of phase shift of the variable delay circuit 6 in the output-side circuit is kept the same and the amount of phase shift of the variable delay circuit 15 in the input-side circuit is retarded by one step (equivalent to one degree unit), then Case 3 is reached. Thus, example 118 alternately transitions between Case 1 and Case 3. According to example 119 of order of evaluation, if the amount of phase shift of variable delay circuit 15 in the input-side circuit is retarded by one step (equivalent to one degree unit) from Case 3, then Case 2 is reached. If the amount of phase shift of the variable delay circuit 15 in the input-side circuit is kept the same and the amount of phase shift of the variable delay circuit 6 in the output-side circuit is retarded by one step (equivalent to one degree unit), then Case 3 is reached. Now if the amount of phase shift of the variable delay circuit 6 in the output-side circuit is kept the same and the amount of phase shift of the variable delay circuit 15 in the input-side circuit is retarded by one step (equivalent to one degree unit), then Case 2 is reached. Thus, example 118 alternately transitions between Case 2 and Case 3.

This means that in the vicinity of a boundary between cases, irrespective of the amount of phase shift in the output-side circuit, one can expect the existence of a point at which a changeover from one case to another can be observed with a change of a single step unit from the amount of phase shift.

Further, irrespective of the amount of phase shift in the input-side circuit, one can expect the existence of a point at which a changeover from one case to another can be observed with a change of a single step unit from the amount of phase shift.

Second Example

Figure 7:
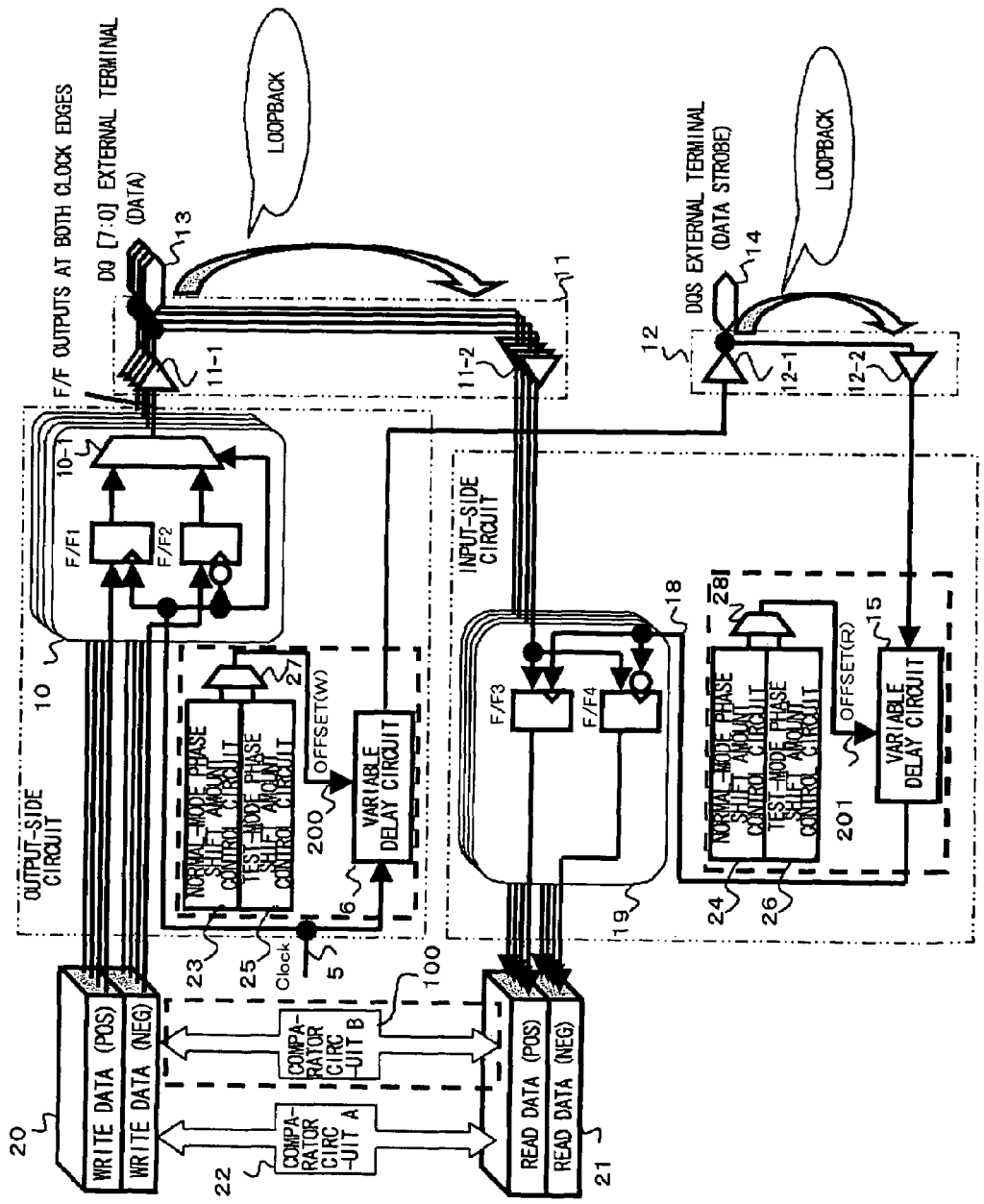
FIG. 7 is a diagram illustrating the configuration of a second example of the present invention.

A second example of the present invention will be described next. FIG. 7 is a diagram illustrating the configuration of the second example. As shown in FIG. 7, this is an example of a DDR SDRAM controller having a circuit configuration in which the output signal of the variable delay circuit 6 in the output-side circuit is output not as the sampling clock of the sampling circuit (flip-flops) of the write data but rather as the write-data strobe signal DQS.

Figure 8:
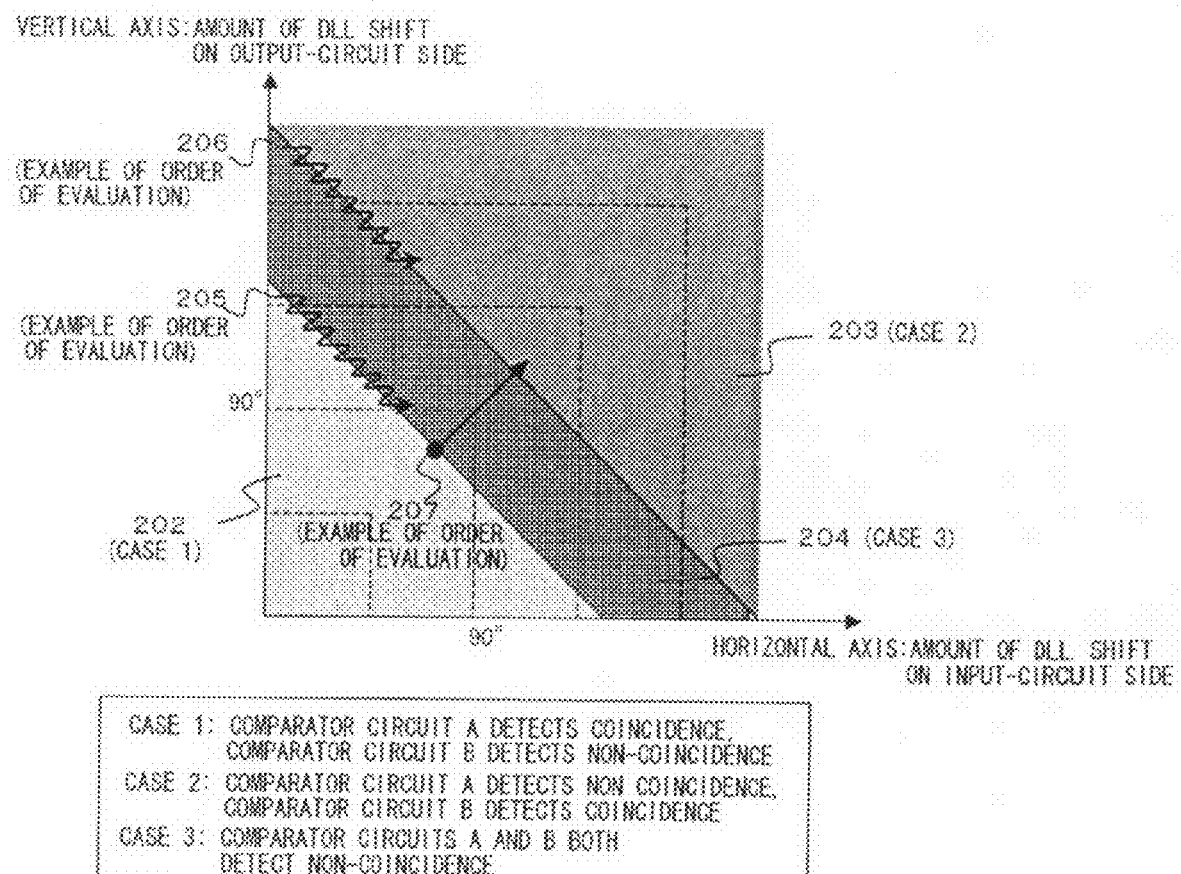
FIG. 8 is a diagram illustrating the relationship between set values of amount of phase shift and results of comparison in the second example.

In this example as well, in a manner similar to that of the first example shown in FIG. 1, three cases (Cases 1, 2, 3) arise as the results of comparisons in the comparator circuit A (22) and comparator circuit B (100) by changing the set values of phase shift amount signals 200, 201 of variable delay circuit 6 in the input-side circuit and variable delay circuit 15 in the output-side circuit. The relationship among these three cases is as illustrated in FIG. 8. In FIG. 8, degree of DLL shift on the read side plotted along the horizontal axis indicates the amount of phase shift of the variable delay circuit 15 in the input-side circuit. Degree of DLL shift on the write side plotted along the vertical axis indicates the amount of phase shift of the variable delay circuit 6 in the output-side circuit.

Since the variable delay circuit 6 in the output-side circuit is provided on the output path of the data strobe signal and not on the side of the write-data output clock, the phase difference between the DQ external terminal 13 and DQS external terminal 14 with respect to the degree indicated by phase shift amount signal 200 of the output-side circuit corresponds to a value obtained by subtracting the degree of phase shift amount signal 101 of FIG. 1 from 180°.

In this example, circuits for bypassing the variable delay circuits of the output-side circuit and input-side circuit are dispensed with in a manner similar to that of the first example shown in FIG. 1. As a result, the characteristics of the clock paths of the output-side circuit and input-side circuit are no longer degraded and burden in terms of assuring timing at the design stage is alleviated. This means that designing a memory controller or memory system is made more efficient and performance is improved.

In FIG. 8, if it can be confirmed that a boundary between Case 1 (202) and Case 3 (204) and a boundary between Case 2 (203) and Case 3 (204) appear while the phase shift amount signals of the output-side circuit and input-side circuit are varied in single-step units, as indicated by the arrows of examples 205 and 206 indicating the order of evaluation, then it will be possible to detect a delay fault in the variable delay circuits within the full range in which each phase shift amount signal is capable of being set.

Furthermore, on the assumption that the characteristics of the variable delay circuits of the output-side circuit and input-side circuit are identical, in a case where the setting of the phase shift amount signal of the output-side circuit and the setting of the phase shift amount signal of the input-side circuit have been varied while keeping the values thereof the same as each other, as indicated by example 207 of the order of evaluation shown in FIG. 8, if it can be confirmed that (a) the set value of the phase shift amount signal at the boundary where there is a changeover from Case 1 to Case and (b) the set value of the phase shift amount signal at the boundary where there is a changeover from Case 3 to Case 2 have the same disparity equally about 90°, then it will be understood that the absolute amount delay when the setting is 90° is appropriate.

There are several other variations of configurations of a memory controller having variable delay circuits besides those of the first and second examples shown in FIGS. 1 and 7, respectively. The loopback test arrangement of the present invention is applicable to these variations as well.

In accordance with the present invention, conducting the loopback test while varying the setting of the phase shift amount signals of the variable delay circuits similarly makes it unnecessary to provide selectors for bypassing the variable delay circuits. In addition, delay faults in the variable delay circuits can be detected by the loopback test.

Other examples of configurations of memory controllers having variable delay circuits are illustrated below. The present invention is applicable fundamentally to these cases as well.

Third Example

Figure 9:
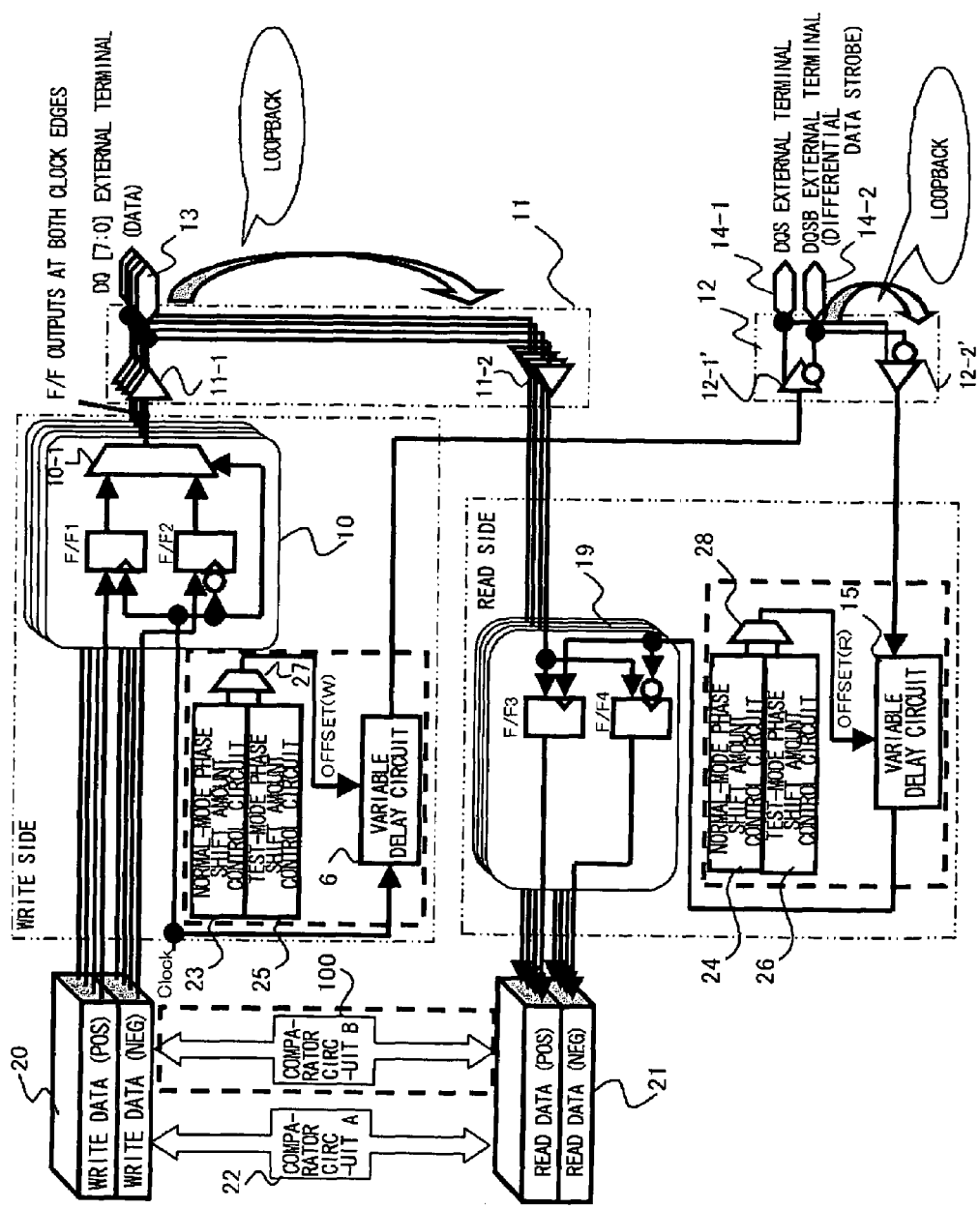
FIG. 9 is a diagram illustrating the configuration of a third example of the present invention.

FIG. 9 is a diagram illustrating the configuration of a third example according to the present invention. This diagram illustrates an example of an arrangement in which the loopback test circuit of the present invention is applied to a DDR2 SDRAM controller. In a DDR2 SDRAM controller, the data strobe is composed of differential signals (DQS, DQSB). The present invention, however, can be applied in similar fashion. Output buffer 12-1' and input buffer 12-2' of the differential signals (DQS, DQSB) of the data strobe comprise differential amplifiers to which the data strobe signal is input differentially and from which a signal is output at a single end. The buffers have a DQS external terminal 14-1 and a DQSB external terminal 14-2 serving as terminals for inputting and outputting the differential data strobe signals DQS, DQSB. Components other that these are similar to those of the first example and need not be described again.

Fourth Example

Figure 10:
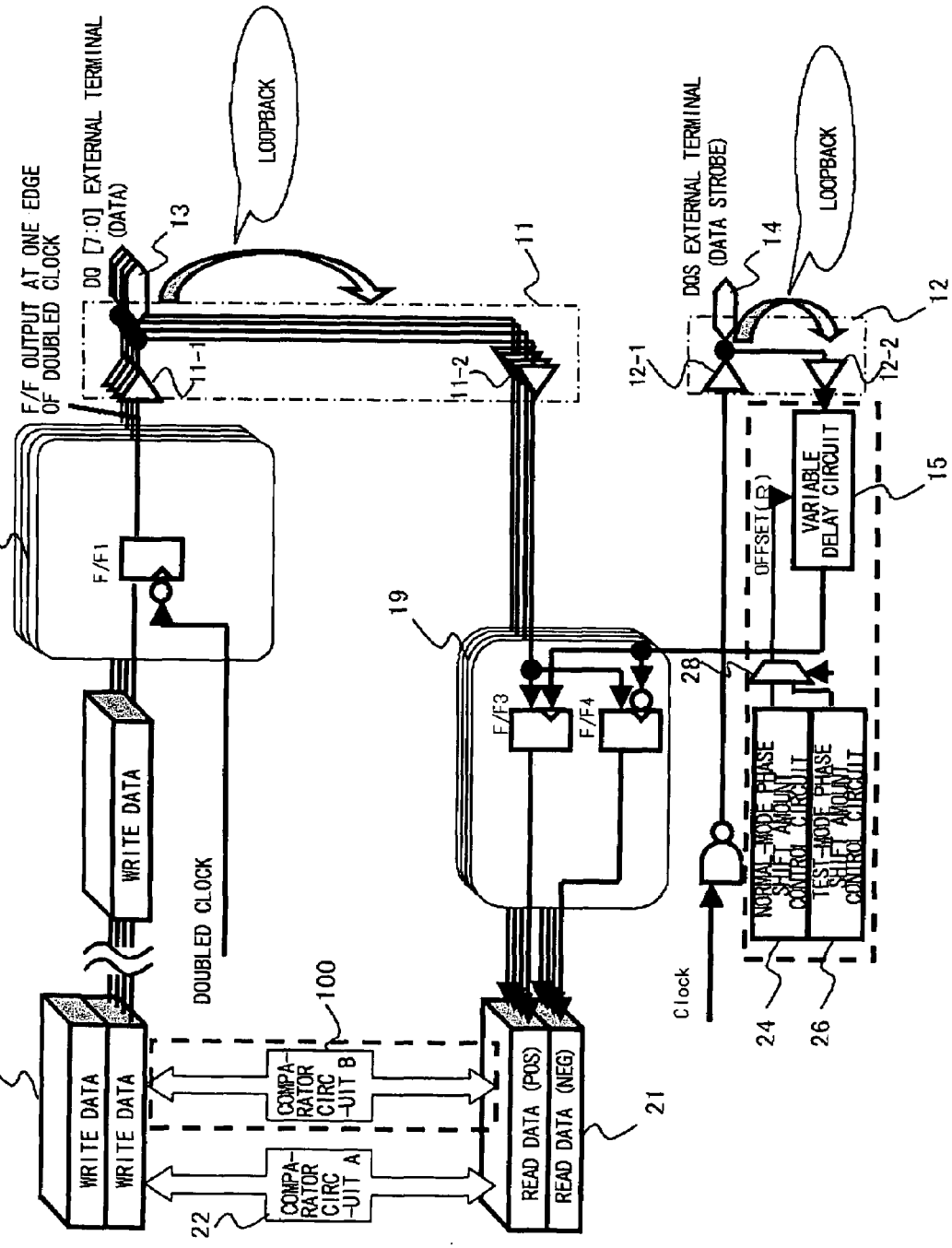
FIG. 10 is a diagram illustrating the configuration of a fourth example of the present invention.

FIG. 10 is a diagram illustrating the configuration of a fourth example of the present invention. This diagram illustrates an example in which the present invention is applied to an arrangement for a case where a clock signal having a frequency that is twice that of the memory clock (system clock) Clock is used as the sampling clock of flip-flops in a write-data sampling circuit 10'.

As shown in FIG. 10, the inverted edge of the doubled clock (DOUBLED CLOCK) is used as the sampling clock applied to a flip-flop F/F1 in the write-data sampling circuit 10' forming the write-data sampling circuit. The flip-flop F/F1 samples the write data at the falling edge of the doubled clock. Since a phase shift of 90° can thus be achieved, a variable delay circuit in the output-side circuit usually is unnecessary. It should be noted that write data supplied to the data terminal of the flip-flop F/F1 to which the doubled clock is input is supplied to the data output circuit 10' as write data (POS) and write data (NEG) driven by the doubled clock. As for the data strobe signal in FIG. 10, a signal (a signal phase-shifted by 180°) obtained by inverting the internal clock signal (Clock), whose frequency is half the frequency of the doubled clock, by an inverter (one input to a NAND gate is HIGH) is supplied to the buffer 12-1 and is output from the DQS external terminal 14. The input-side circuit is driven by the internal clock signal (Clock) and has the same configuration as that of the first example in FIG. 1. A comparison with expected values (write data) in the comparator circuit A (22) and comparator circuit B (100) is performed in a manner similar to that of the first example. In this case also the test method of the present invention can be applied by varying the setting of the phase shift amount signal of the input-side circuit and confirming the results of the comparison operations performed by the comparator circuit A (22) and comparator circuit B (100).

Fifth Example

Figure 11:
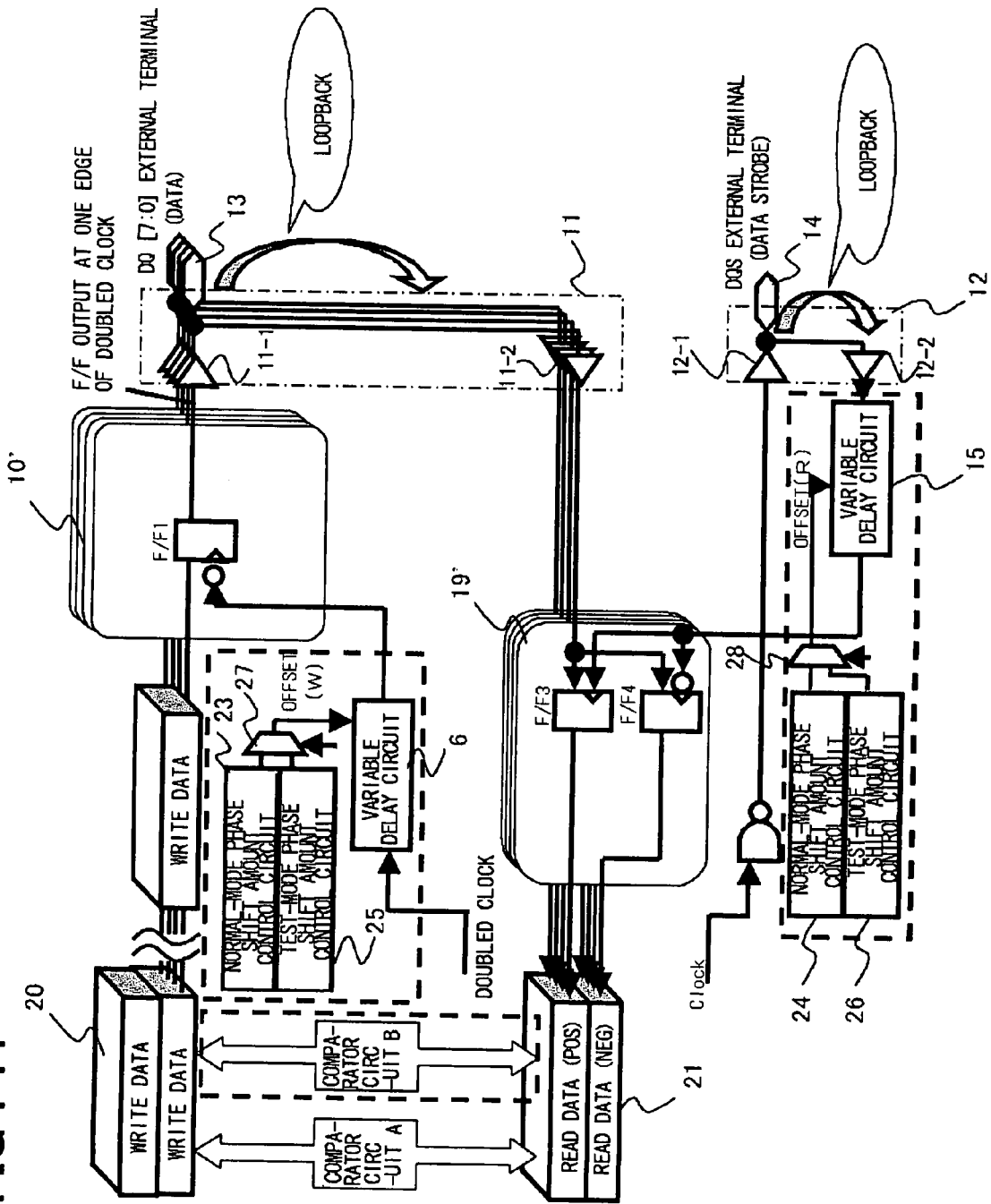
FIG. 11 is a diagram illustrating the configuration of a fifth example of the present invention.
Figure 12A:
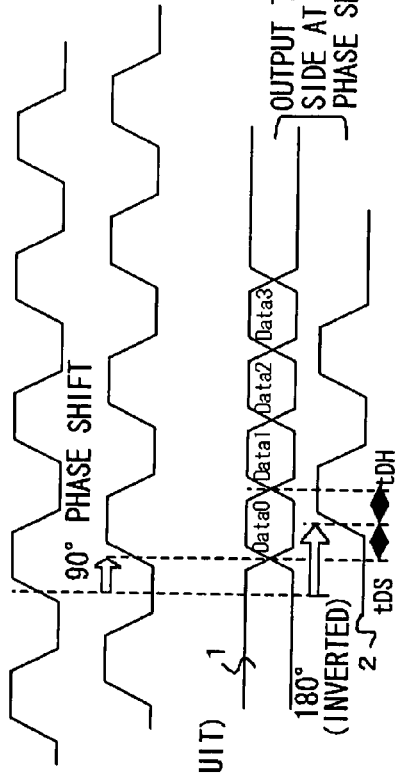
FIGS. 12A and 12B are timing waveform diagrams illustrating memory access (write and read, respectively) operations during normal operation of a DDR SDRAM.
Figure 12B:
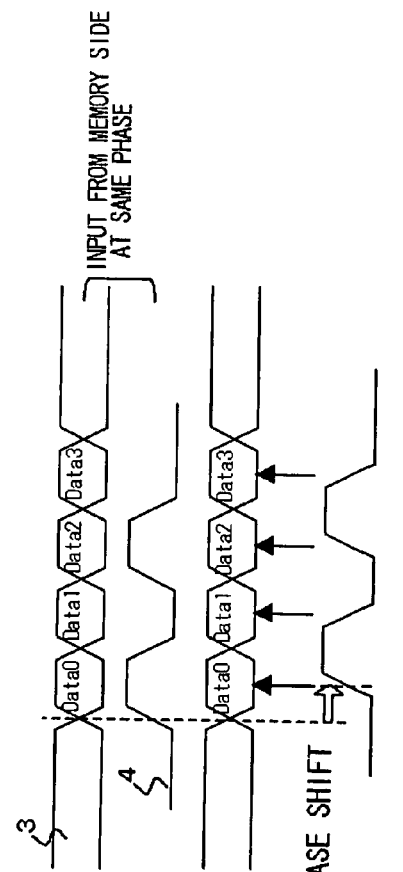

FIG. 11 is a diagram illustrating the configuration of a fifth example according to the present invention. In the arrangement of FIG. 11, the output-side circuit is provided with the normal-mode phase shift amount control circuit 23, test-mode phase shift amount control circuit 25, selector 27 and variable delay circuit 6, and a shift in the phase of the doubled clock is controlled. More specifically, an internal clock signal whose frequency is double that of the internal clock (Clock) used also as the memory clock is employed as the sampling clock of the flip-flop F/F1 in the write-data sampling circuit 10'. The inverted edge of the doubled-frequency clock is used as the clock of the flip-flop F/F1. Since a phase shift of 90° is thus achieved, a variable delay circuit in the output-side circuit is unnecessary, just as illustrated in FIG. 10. However, the variable delay circuit 6 is used in order to perform phase shift of about 180° and fine delay adjustment of the doubled-frequency clock.

The actions and effects of each of the foregoing examples will now be described.

The burden involved in assuring memory-access timing is mitigated.

Detection of a delay fault in the phase shifting function of a variable delay circuit is possible with a loopback test.

The arrangement adopted is one in which the data signal and data strobe signal are input and output to and from common input/output terminals in accordance with the configuration of a DDR SDRAM controller. Naturally, however, the present invention can also be applied to an arrangement in which the data signal and data strobe signal are separated and the data output terminal and input terminal are separated. Further, in a DDR SDRAM, etc., the clock for driving the memory is supplied as a differential clock signal. However, the present invention is not limited to such an arrangement and naturally is applicable also to an arrangement in which the clock for driving the memory is output at a single end. In a case where the clock for driving the memory is transmitted at a single end, there is a case where the clock has the same phase as that of the internal clock signal of the memory controller as well as a case where the clock is output in the opposite phase. In accordance with the particular application, the memory may be driven using a clock obtained by frequency-dividing a clock that is the result of frequency-multiplying the internal clock.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An interface circuit comprising:
   an output-side circuit that outputs a data signal and a data strobe signal which stipulates sampling timing of the data signal; and
   an input-side circuit that inputs a data signal and a data strobe signal;
   the interface circuit complying with predetermined specifications in which phase relationships between the data signal and the data strobe signal in the data output and input take on respective ones of prescribed relationships;
   wherein said output-side circuit includes:
   a first selector that receives as inputs a first phase shift amount signal which stipulates a phase shift amount when a normal mode is in effect and a second phase shift amount signal which stipulates a phase shift amount when a test mode is in effect, and selects the first phase shift amount signal when the normal mode is in effect and the second phase shift amount signal when the test mode is in effect;
   a first variable delay circuit that receives a clock signal and adds to the clock signal a delay conforming to the phase shift amount signal selected by said first selector to supply the resultant signal as a sampling clock signal; and
   an output-data sampling circuit that samples the data signal output responsive to the sampling clock signal from the first variable delay circuit;
   a signal obtained by phase-shifting the clock signal a fixed amount being output as the data strobe signal; and wherein
   said input-side circuit includes:
   a second selector that receives as inputs a third phase shift amount signal which stipulates a phase shift amount when a normal mode is in effect and a fourth phase shift amount signal which stipulates a phase shift amount when a test mode is in effect, and selects the third phase shift amount signal when the normal mode is in effect and the fourth phase shift amount signal when the test mode is in effect;
   a second variable delay circuit that receives the data strobe signal input thereto and adds to the data strobe signal a delay conforming to the phase shift amount signal selected by said second selector to supply the resultant signal as a sampling clock signal; and
   an input-data sampling circuit that samples the data signal input thereto responsive to the sampling clock signal from the second variable delay circuit.

2. The interface circuit according to claim 1, wherein said first and second variable delay circuits each include a delay locked loop circuit.

3. The interface circuit according to claim 1, further comprising:
   a first comparator circuit that compares, as expected values, input data sampled by said input-side circuit and output data corresponding to the input data at the time of a loopback test in which the data signal and data strobe signal, which have been output from respective output buffers, are looped back and received by respective corresponding input buffers; and
   a second comparator circuit that compares, as expected values, the input data and output data the sampling timing of which differs from that of the input data.

4. The interface circuit according to claim 3, wherein delay analysis is performed by varying the amount of delay by the second and fourth phase shift amounts selected by said first and second selectors, respectively, at the time of the loopback test.

5. The interface circuit according to claim 1, wherein said output-side circuit further includes:
   a first normal-mode phase shift amount control circuit that supplies the first phase shift amount signal; and
   a first test-mode phase shift amount control circuit that supplies the second phase shift amount signal; and wherein
   said input-side circuit further includes:
   a second normal-mode phase shift amount control circuit that supplies the third phase shift amount signal; and
   a second test-mode phase shift amount control circuit that supplies the fourth phase shift amount signal;
   said first and second normal-mode phase shift amount control circuits and said first and second test-mode phase shift amount control circuits each including a register for setting and storing a respective phase shift amount fixedly or variably.

6. A semiconductor device having an interface circuit set forth in claim 1.

7. A memory controller having an interface circuit set forth in claim 1, said controller inputting and outputting data and a data strobe signal to and from a clock-synchronized memory.

8. The memory controller according to claim 7, wherein when the normal mode is in effect, the data signal that is output is write data to said memory, the input data is read data from said memory, the data strobe signal that is output is a data strobe signal to said memory, and the data strobe signal that is input is a data strobe signal from said memory;
   the clock signal is a clock signal having a frequency identical with that of a clock that drives said memory; and
   when the loopback test mode is in effect, an output terminal and an input terminal of the data signal are connected, and an output terminal and an input terminal of the data strobe signal are connected.

9. An interface circuit comprising:
   an output-side circuit that outputs a data signal and a data strobe signal which stipulates sampling timing of the data signal; and
   an input-side circuit that inputs a data signal and a data strobe signal;
   the interface circuit complying with predetermined specifications in which phase relationships between the data signal and the data strobe signal in the data output and input take on respective ones of prescribed relationships;
   wherein said output-side circuit includes:
   an output-data sampling circuit that samples the data signal responsive to a clock obtained by frequency-multiplying a clock signal;
   a signal obtained by phase-shifting the clock signal a fixed amount being output as the data strobe signal; and wherein
   said input-side circuit includes:
   a first selector that receives as inputs a first phase shift amount signal which stipulates a phase shift amount when a normal mode is in effect and a second phase shift amount signal which stipulates a phase shift amount when a test mode is in effect, and selects the first phase shift amount signal when the normal mode is in effect and the second phase shift amount signal when the test mode is in effect;
   a first variable delay circuit that receives the data strobe signal input thereto, and adds to the data strobe signal a delay conforming to the phase shift amount signal selected by said first selector, to supply the resultant signal as a sampling clock signal; and an input-data sampling circuit that samples the data signal input thereto responsive to the sampling clock signal from the first variable delay circuit.

10. A memory controller having an interface circuit set forth in claim 9, said controller inputting and outputting data and a data strobe signal to and from a clock-synchronized memory.

11. The interface circuit according to claim 9, wherein said output-side circuit further includes:

a second selector that receives as inputs a third phase shift amount signal which stipulates a phase shift amount when a normal mode is in effect and a fourth phase shift amount signal which stipulates a phase shift amount when a test mode is in effect, and selects the third phase shift amount signal when the normal mode is in effect and the fourth phase shift amount signal when the test mode is in effect; and a second variable delay circuit that receives the frequency-multiplied clock signal, and outputs, as a data strobe signal, a signal obtained by adding to the clock signal a delay conforming to the phase shift amount signal selected by said second selector.

12. An interface circuit according to claim 9, further comprising:

a first comparator circuit that compares, as expected values, input data sampled by said input-side circuit and output data corresponding to the input data at the time of a loopback test in which the data signal and data strobe signal, which have been output from respective output buffers, are looped back and enter from respective corresponding input buffers; and a second comparator circuit that compares, as expected values, the input data and output data the sampling timing of which differs from that of the input data.

13. The memory controller according to claim 10, wherein when the normal mode is in effect, the data signal that is output is write data to said memory, the input data is read data from said memory, the data strobe signal that is output is a data strobe signal to said memory, and the data strobe signal that is input is a data strobe signal from said memory;

the clock signal is a clock signal having a frequency identical with that of a clock that drives said memory; and when the loopback test mode is in effect, an output terminal and an input terminal of the data signal are connected, and an output terminal and an input terminal of the data strobe signal are connected.

14. An interface circuit comprising:

an output-side circuit that outputs a data signal and a data strobe signal which stipulates sampling timing of the data signal; and an input-side circuit that inputs a data signal and a data strobe signal;

the interface circuit complying with predetermined specifications in which phase relationships between the data signal and the data strobe signal in the data output and input take on respective ones of prescribed relationships;

wherein said output-side circuit includes:

a first selector that receives as inputs a first phase shift amount signal which stipulates a phase shift amount when a normal mode is in effect and a second phase shift amount signal which stipulates a phase shift amount when a test mode is in effect, and selects the first phase shift amount signal when the normal mode is in effect and the second phase shift amount signal when the test mode is in effect;

a first variable delay circuit that receives a clock signal and outputs, as a data strobe signal, a signal obtained by adding to the clock signal a delay conforming to the phase shift amount signal selected by said first selector; and an output-data sampling circuit that samples the data signal using the clock signal as a sampling clock signal; and wherein said input-side circuit includes:

a second selector that receives as inputs a third phase shift amount signal which stipulates a phase shift amount when a normal mode is in effect and a fourth phase shift amount signal which stipulates a phase shift amount when a test mode is in effect, and selects the third phase shift amount signal when the normal mode is in effect and the fourth phase shift amount signal when the test mode is in effect; and a second variable delay circuit that receives the data strobe signal input thereto, adds to the data strobe signal a delay conforming to the phase shift amount signal selected by said second selector to supply the resultant signal as a sampling clock signal; and an input-data sampling circuit that samples the data signal input thereto responsive to the sampling clock signal from the second variable delay circuit.

15. A memory controller having an interface circuit set forth in claim 14, said controller inputting and outputting data and a data strobe signal to and from a clock-synchronized memory.

16. The memory controller according to claim 15, wherein when the normal mode is in effect, the data signal that is output is write data to said memory, the input data is read data from said memory, the data strobe signal that is output is a data strobe signal to said memory, and the data strobe signal that is input is a data strobe signal from said memory;

the clock signal is a clock signal having a frequency identical with that of a clock that drives said memory; and when the loopback test mode is in effect, an output terminal and an input terminal of the data signal are connected, and an output terminal and an input terminal of the data strobe signal are connected.

17. The interface circuit according to claim 14, further comprising:

a first comparator circuit that compares, as expected values, input data sampled by said input-side circuit and output data corresponding to the input data at the time of a loopback test in which the data signal and data strobe signal, which have been output from respective output buffers, are looped back and received by respective corresponding input buffers; and a second comparator circuit that compares, as expected values, the input data and output data the sampling timing of which differs from that of the input data.

18. The interface circuit according to claim 14, wherein said output-side circuit further includes:

a first normal-mode phase shift amount control circuit that supplies the first phase shift amount signal; and a first test-mode phase shift amount control circuit that supplies the second phase shift amount signal; and wherein said input-side circuit further includes:

a second normal-mode phase shift amount control circuit that supplies the third phase shift amount signal; and a second test-mode phase shift amount control circuit that outputs the fourth phase shift amount signal;

said first and second normal-mode phase shift amount control circuits and said first and second test-mode phase shift amount control circuits each including a register for setting and storing a respective phase shift amount fixedly or variably.

19. The interface circuit according to claim 14, wherein said first and second variable delay circuits each include a delay locked loop circuit.

* * * * *